United States Patent
Osawa et al.

(10) Patent No.: US 10,541,382 B2
(45) Date of Patent: Jan. 21, 2020

(54) ELECTROLUMINESCENT DEVICE CAPABLE OF PREVENTING COLORATION OF FRONT REFLECTED LIGHT

(71) Applicant: Konica Minolta Inc., Tokyo (JP)

(72) Inventors: Kou Osawa, Hino (JP); Koujirou Sekine, Ibaraki (JP); Naoki Kimura, Takatsuki (JP)

(73) Assignee: KONICA MINOLTA, INC., Tokyo (JP)

( * ) Notice: Subject to any disclaimer, the term of this patent is extended or adjusted under 35 U.S.C. 154(b) by 27 days.

(21) Appl. No.: 16/069,575

(22) PCT Filed: Aug. 29, 2016

(86) PCT No.: PCT/JP2016/075120
§ 371 (c)(1),
(2) Date: Jul. 12, 2018

(87) PCT Pub. No.: WO2017/122386
PCT Pub. Date: Jul. 20, 2017

(65) Prior Publication Data
US 2019/0036081 A1 Jan. 31, 2019

(30) Foreign Application Priority Data
Jan. 14, 2016 (JP) .................. 2016-005477

(51) Int. Cl.
*H01J 63/04* (2006.01)
*H01L 51/52* (2006.01)

(52) U.S. Cl.
CPC ................ *H01L 51/5265* (2013.01)

(58) Field of Classification Search
CPC ..... H01L 51/5265; H01L 51/50; H05B 33/24; H05B 33/12
See application file for complete search history.

(56) References Cited

U.S. PATENT DOCUMENTS

| 7,196,468 B2 * | 3/2007 | Fukuda ............... H01L 51/5281 313/504 |
| 7,268,485 B2 | 9/2007 | Tyan et al. |

(Continued)

FOREIGN PATENT DOCUMENTS

| JP | H02100288 A | 4/1990 |
| JP | 2006049463 A | 2/2006 |

(Continued)

OTHER PUBLICATIONS

International Search Report, PCT/JP2016/075120, dated Nov. 2016.
Extended European Search Report dated Nov. 28, 2018 from European Application No. 16884989.1.

*Primary Examiner* — Tracie Y Green
(74) *Attorney, Agent, or Firm* — Lucan & Mercanti, LLP

(57) ABSTRACT

Provided is an electroluminescent device that emits light of a single color and includes a plurality of functional layers, in which an absorption peak is included in the emission wavelength and at least one absorption peak is included in a complementary color region of an emission wavelength in the range of 380 nm to 780 nm, an absolute value of a deviation (Δuv) of a color coordinate of front reflected light at the time of white color illumination from a blackbody locus is below 0.02, and a refractive index and a film thickness of each of the plurality of functional layers are determined to satisfy the formula $D(\theta) \geq D(0)\cos\theta$ ($0 \leq \theta \leq \theta_D \leq 60$ degrees) when an angle dependence of emission intensity is defined as $D(\theta)$.

16 Claims, 20 Drawing Sheets

(56) References Cited

U.S. PATENT DOCUMENTS

| | | |
|---|---|---|
| 2007/0252520 A1 | 11/2007 | Hasegawa |
| 2008/0211390 A1* | 9/2008 | D'Andrade ......... H01L 51/5265 |
| | | 313/504 |
| 2011/0187259 A1 | 8/2011 | Fukuda et al. |
| 2012/0206675 A1 | 8/2012 | Seo et al. |
| 2014/0191226 A1 | 7/2014 | Yamae |
| 2016/0197310 A1* | 7/2016 | Kubota ............... H01L 51/5281 |
| | | 313/512 |

FOREIGN PATENT DOCUMENTS

| | | |
|---|---|---|
| JP | 2007316611 A | 12/2007 |
| JP | 2010192138 A | 9/2010 |
| JP | 2012054091 A | 3/2012 |
| JP | 2013157226 A | 8/2013 |
| JP | 2014048610 A | 3/2014 |
| JP | 2015038859 A | 2/2015 |

* cited by examiner

FIG. 7

| EMISSION WAVELENGTH $\lambda_0$ [nm] | HUE $H_0$ [degrees] OF EMISSION WAVELENGTH | HUE CENTER H [degrees] OF COMPLEMENTARY COLOR | DESIRED RANGE OF HUE H (LEFT VALUE OR MORE AND RIGHT VALUE OR LESS) [degrees] | DESIRED ABSORPTION WAVELENGTH RANGE (LEFT VALUE OR MORE AND RIGHT VALUE OR LESS) |
|---|---|---|---|---|
| 380 | 256.3 | 76.3 | 16.3 TO 136.3 | 533nm TO 588nm |
| 464 | 240 | 60 | 0 TO 120 | 550nm TO 611nm |
| 480 | 210 | 30 | 330 TO 90 | 562nm TO 780nm |
| 492 | 180 | 0 | 300 TO 60 | 570nm TO 780nm |
| 510 | 150 | 330 | 270 TO 30 | 580nm TO 780nm |
| 550 | 120 | 300 | 240 TO 0 | 380nm TO 464nm AND 611nm TO 780nm |
| 562 | 90 | 270 | 210 TO 330 | 380nm TO 480nm |
| 570 | 60 | 240 | 180 TO 300 | 380nm TO 492nm |
| 580 | 30 | 210 | 150 TO 270 | 380nm TO 510nm |
| 611 | 0 | 180 | 120 TO 240 | 464nm TO 550nm |
| 660 | -5.2 | 174.8 | 114.8 TO 234.8 | 469nm TO 552nm |
| 780 | -6.2 | 173.8 | 113.8 TO 233.8 | 470nm TO 553nm |

FIG. 8

| EMISSION WAVELENGTH $\lambda_0$ [nm] | HUE $H_0$ [degrees] OF EMISSION WAVELENGTH | HUE CENTER H [degrees] OF COMPLEMENTARY COLOR | DESIRED RANGE OF HUE H (LEFT VALUE OR MORE AND RIGHT VALUE OR LESS) [degrees] | DESIRED ABSORPTION WAVELENGTH RANGE (LEFT VALUE OR MORE AND RIGHT VALUE OR LESS) |
|---|---|---|---|---|
| 380 | 256.3 | 76.3 | 46.3 TO 106.3 | 556nm TO 574nm |
| 464 | 240 | 60 | 30 TO 90 | 562nm TO 580nm |
| 480 | 210 | 30 | 0 TO 60 | 570nm TO 611nm |
| 492 | 180 | 0 | 330 TO 30 | 580nm TO 780nm |
| 510 | 150 | 330 | 300 TO 0 | 600nm TO 780nm |
| 550 | 120 | 300 | 270 TO 330 | 611nm TO 780nm AND 380nm TO 464nm |
| 562 | 90 | 270 | 240 TO 300 | 380nm TO 464nm |
| 570 | 60 | 240 | 210 TO 270 | 380nm TO 480nm |
| 580 | 30 | 210 | 180 TO 240 | 464nm TO 492nm |
| 611 | 0 | 180 | 150 TO 210 | 480nm TO 510nm |
| 660 | -5.2 | 174.8 | 144.8 TO 204.8 | 483nm TO 518nm |
| 780 | -6.2 | 173.8 | 143.8 TO 203.8 | 483nm TO 520nm |

FIG. 9

| NAME OF FUNCTIONAL LAYER | COMPONENT | FILM THICKNESS | REFRACTIVE INDEX | | |
|---|---|---|---|---|---|
| | | | BLUE (464 nm) | GREEN (550 nm) | RED (611 nm) |
| REFLECTIVE ELECTRODE | Al | 100 nm | 0.60+4.67i | 0.86+5.47i | 1.13+5.95i |
| LIGHT EMITTING FUNCTIONAL LAYER | ORGANIC MATERIAL | L | 1.90 | 1.82 | 1.79 |
| TRANSPARENT ELECTRODE | THIN FILM Ag | 10 nm | 0.60+2.61i | 0.13+3.33i | 0.13+3.80i |
| | UNDERLAYER | 50 nm | 1.90 | 1.82 | 1.79 |
| TRANSPARENT SUBSTRATE | RESIN FILM | 500 μm | 1.51 | 1.50 | 1.50 |

| POSITION OF LIGHT EMITTING POINT | DISTANCE d FROM REFLECTIVE ELECTRODE SURFACE |
|---|---|

(a) CASE WHERE OPTICAL BUFFER LAYER IS PROVIDED ON TRANSPARENT ELECTRODE SIDE (b) CASE WHERE OPTICAL BUFFER LAYER IS PROVIDED ON REFLECTIVE ELECTRODE SIDE

REFLECTANCE CALCULATION RESULT IN
ELECTROLUMINESCENT DEVICE (L=320 nm, d=60 nm)

CALCULATION RESULT OF ANGLE DEPENDENCE OF EMISSION
LUMINANCE IN ELECTROLUMINESCENT DEVICE (L=320 nm, d=60 nm)

REFLECTANCE CALCULATION RESULT IN
ELECTROLUMINESCENT DEVICE (L=500 nm, d=60 nm)

CALCULATION RESULT OF ANGLE DEPENDENCE OF EMISSION
LUMINANCE IN ELECTROLUMINESCENT DEVICE (L=320 nm, d=60 nm)

ANGLE DEPENDENCE OF EMISSION LUMINANCE

ELECTROLUMINESCENT DEVICE CAPABLE OF PREVENTING COLORATION OF FRONT REFLECTED LIGHT

CROSS REFERENCE TO RELATED APPLICATION

This Application is a 371 of PCT/JP2016/075120 filed on Aug. 29, 2016 which, in turn, claimed the priority of Japanese Patent Application No. 2016-005477 filed on Jan. 14, 2016, all applications are incorporated herein by reference.

TECHNICAL FIELD

The present invention relates to an electroluminescent device.

BACKGROUND ART

In recent years, electroluminescent devices with high luminous efficiency using electroluminescent devices such as light emitting diodes (LEDs) and organic ELs have attracted attention. An electroluminescent device includes an emissive layer sandwiched between planar-type cathode and anode (emissive layer), typically configured with a transparent electrode as the anode and a metal reflective electrode as the cathode in many cases. Applications of electroluminescent devices include cases of lighting that needs luminance with a specific angular range with a specific color, such as downlights for decorative illumination, colored spotlights in theaters, colored signaling flashlights, traffic signals, colored front lights, backlights, brake lights for cars.

In typical cases, however, angular distribution (light distribution) of the light intensity in the electroluminescent device using the electroluminescent device is Lambertian light distribution represented by cos θ, having difficulty in achieving a light source capable of emitting light with high intensity in a specific angular range.

Meanwhile, there are proposed techniques disclosed as a background art including a technique of arranging an optical multilayer film near a light emitting functional layer to adjust light distribution and emission color as disclosed in JP 2015-038859 A (Patent Literature 1) and JP 2013-157226 A (Patent Literature 2), and a technique of arranging an optical filter outside the device to correct a color shift of reflected light as disclosed in JP 2014-048610 A (Patent Literature 3).

CITATION LIST

Patent Literature

Patent Literature 1: JP 2015-038859 A
Patent Literature 2: JP 2013-157226 A
Patent Literature 3: JP 2014-048610 A

SUMMARY OF INVENTION

Technical Problem

However, while the configurations disclosed in Patent Literatures 1 and 2 give consideration to adjustment of the emission spectrum and light distribution control, there still is a problem of undefined design for achieving reflected light of white color with light distribution directed toward the front.

The configuration disclosed in Patent Literature 3 includes a problem of necessity of providing a separate member causing complication in configuration, and a problem of insufficient consideration of adjustment of the emission spectrum and light distribution control, causing unavailability of filter design for variables of light distribution adjustment.

The present invention has been made in view of the above problems, and aims to provide a monochromatic electroluminescent device capable of preventing coloration of reflected light at white light emission while achieving light intensity within a certain angular range from the front.

Solution to Problem

Provided is an electroluminescent device that emits light of a single color and includes a plurality of functional layers, in which an absorption peak is included in the emission wavelength and at least one absorption peak is included in a complementary color region of an emission wavelength in the range of 380 nm to 780 nm, an absolute value of a deviation ($\Delta uv$) of a color coordinate of front reflected light at the time of white color illumination from a blackbody locus is below 0.02, and a refractive index and a film thickness of each of the plurality of functional layers are determined to satisfy the formula $D(\theta) \geq D(0)\cos\theta$ ($0 \leq \theta \leq \theta_D \leq 60$ degrees) when an angle dependence of emission intensity is defined as $D(\theta)$.

Advantageous Effects of Invention

According to the electroluminescent device, it is possible to provide a monochromatic electroluminescent device capable of preventing coloration of reflected light at the time of white color illumination while achieving light intensity within a certain angular range from the front.

BRIEF DESCRIPTION OF DRAWINGS

FIG. 7 is a diagram Illustrating a relationship between a hue of a desired complementary color and an absorption wavelength range based on Formula (4).

FIG. 8 is a diagram illustrating a relationship between a hue of a desired complementary color and an absorption wavelength range based on Formula (5).

FIG. 9 is a diagram illustrating an optical design table of an organic EL as an electroluminescent device with emission color of red.

FIG. 14 is a diagram illustrating an optically equivalent model of the electroluminescent device in a fourth embodiment, in which

FIG. 15 is a diagram illustrating an optically equivalent model of the electroluminescent device of another aspect of the fourth embodiment, in which

FIG. 16 is a diagram illustrating an optically equivalent model of the electroluminescent device of the fifth embodiment, in which

FIG. 23 is a diagram illustrating a configuration of a microcavity in an eighth embodiment, in which

FIG. 28 includes diagrams illustrating angle dependence of emission luminance, in which

DESCRIPTION OF EMBODIMENTS

Figure 1:
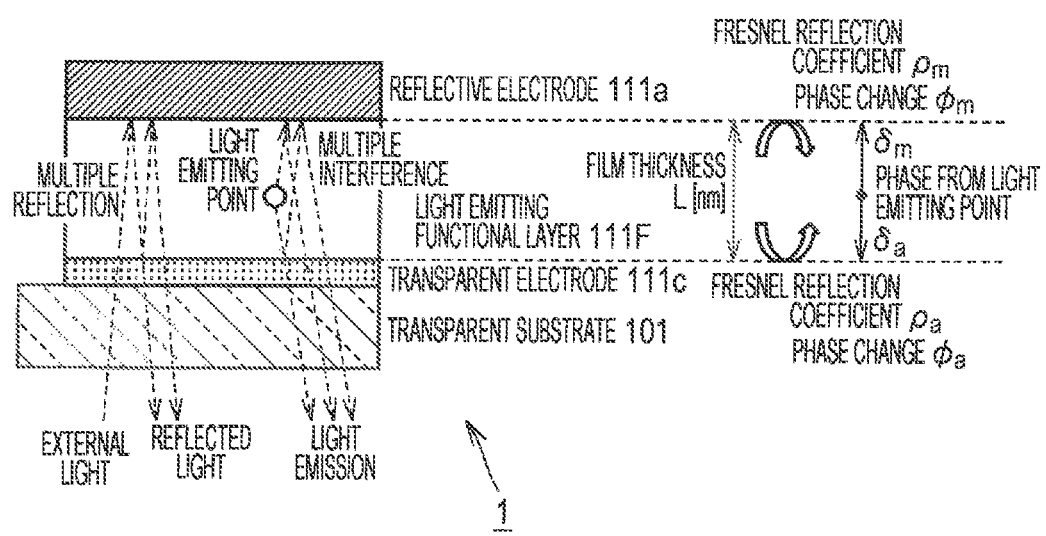
FIG. 1 is a diagram illustrating an electroluminescent device and its optical arrangement in a first embodiment.

Hereinafter, an electroluminescent device according to embodiments of the present invention will be described with reference to the drawings. Note that in the embodiments described below, any reference to the number, amount, or the like, is not intended to limit the scope of the present invention to such number, amount, or the like, unless otherwise specified. Moreover, same or equivalent components are denoted by a same reference numeral, and redundant description will not be repeated in some cases. It is originally intended that configurations of individual embodiments are appropriately combined to be used.

First Embodiment

With reference to FIG. 1, an electroluminescent device 1 according to the present embodiment and optical arrangement thereof will be described. FIG. 1 is a diagram illustrating a configuration and an optical arrangement of the electroluminescent device 1 according to the present embodiment.

The electroluminescent device 1 has a structure including a stack of a transparent electrode 111c, a light emitting functional layer 111F, and a reflective electrode 111a in this order on a transparent substrate 101 as a transparent member. The light emitting functional layer 111F is internally divided into a plurality of functional layers in accordance with the necessity of injection and transfer of electrons and holes. For example, it is allowable to arrange "hole injecting layer/hole transfer layer/emissive layer/electron transfer layer/electron injection layer" from the transparent electrode 111c side.

The light emitting functional layer 111F internally includes at least one emissive layer. Excitons are generated in the emissive layer, leading to transition of light emission. Note that while the position where excitons are generated can be distributed in the emissive layer, light emission may be assumed to occur at optical centroid position of the exciton distribution. For the sake of convenience, the centroid position of this exciton distribution is referred to as "light emitting point".

The centroid wavelength of energy at light emission of the electroluminescent device 1 is defined as $\lambda p$, and is referred to as an emission wavelength of the electroluminescent device 1. In the present embodiment, the transparent electrode 111c, the light emitting functional layer 111F, and the reflective electrode 111a are collectively referred to as "a plurality of functional layers".

The electroluminescent device 1 according to the present embodiment includes an absorption peak in the emission wavelength and includes at least one absorption peak in a complementary color region of an emission wavelength in the range of 380 nm to 780 nm, an absolute value of a deviation Δuv of a color coordinate of front reflected light at the time of white color illumination from a blackbody locus is below 0.02, and a refractive index and a film thickness of each of the plurality of functional layers are determined to satisfy the following formula 1 when an angle dependence of light intensity is defined as D(θ).

[Mathematical Expression 1]

$$D(\theta) \geq D(0)\cos\theta \, (0 \leq \theta \leq \theta_D \leq 60 \text{ degrees})$$  Formula (1)

With this configuration, it is possible to achieve a single color-emitting electroluminescent device capable of obtaining colorless external light reflection at the time of non-emission while achieving light intensity within a certain angle from the front.

Effects of the electroluminescent device 1 according to the present embodiment will be described with reference to FIG. 1. First, a relationship between the front intensity and the reflectance in the electroluminescent device 1 will be described. According to "Hiroshi Kobayashi (supervisor), Yoichiro Nakanishi and Gen'ichi Hatakoshi (cowriter and coeditor), Physics and Applications of Light Emission and Detection", Tokyo, Baifukan (2008) pp. 112 to 117", the relationship between the optical arrangement of the electroluminescent device 1 and the front intensity can be described as the following Formula (2).

[Mathematical Expression 2]

$$T = \frac{(1-|\rho_m|^2)\{1+|\rho_a|^2+2|\rho_a|\cos(2\delta_a-\phi_o)\}}{1+|\rho_m|^2\,|\rho_a|^2-2|\rho_m||\rho_a|\cos(2\delta_m-\phi_a-\phi_o)}$$  Formula (2)

Note that the symbols in the Formula (2) are defined to match the symbols in FIG. 1. For example, it can be seen from Formula (2) that the red front reflectance tends to decrease in the design of increasing the red front intensity.

Next, a condition for mutually weakening reflected light by multiple interference at reflection of external light at the electroluminescent device 1 will be described. A portion between the reflective electrode 111a and the transparent electrode 111c can be regarded as a minute resonator. Resonance absorption occurs when the resonator becomes resonant. This corresponds to the case having a phase change of an integral multiple of 2π in consideration of the Fresnel reflection coefficient, as given by the following Formula (3).

[Mathematical Expression 3]

$$2 \times n_{EL} \frac{2\pi}{\lambda} \times L + \phi_m + \phi_o = 2m\pi \Leftrightarrow L = \frac{\lambda}{2n_{EL}}\left(m - \frac{\phi_m + \phi_a}{2\pi}\right)$$  Formula (3)

In Formula (3), $n_{EL}$, is an average refractive index of the light emitting functional layer 111F. In addition, $\phi_m$ and $\phi_a$ represent phase changes in units of [rad] when light is reflected by the reflective electrode 111a and the transparent electrode 111c, having values of 0 to 2π. It can be seen from the Formula (3) the wavelength at which the reflected light is weakened changes with the change in the film thickness.

As compared with a case of the background art in consideration of a characteristic at the time of light emission alone in view of Formula (2) alone, the present embodiment also considers a phase condition of reflected light expressed by Formula (3). This configuration is provided to achieve a single color-emitting light emitting device capable of obtaining colorless external light reflection at the time of non-emission while achieving light intensity within a certain angle from the front.

In the present embodiment, "emitting a single color" means that color coordinates are sufficiently separated from white light defined by International Commission on Illumination (Commission Internationale de L'Eclairage: CIE). In particular, it is desirable that the saturation is 50% or more when viewed in the HSV color space devised by Alvy Ray Smith in 1978, while it is desirable that an xy distance from a white point of white 6500K is 0.1 or more when viewed in the Yxy color space defined by the International Commission on Illumination (CIE). In this manner, with sufficient separation from the white point, it is possible to convey color information to the viewer when visually recognized.

Figure 2A:
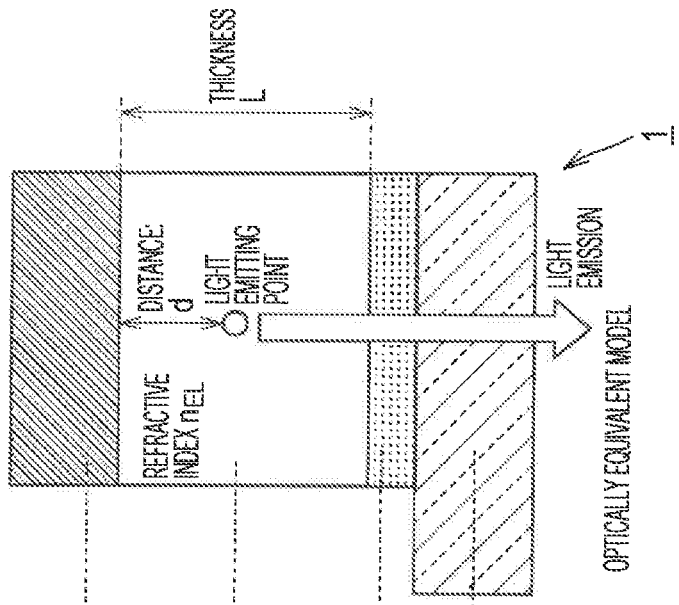
FIG. 2A is a cross-sectional view Illustrating a specific configuration of the electroluminescent device in the first embodiment.
Figure 2B:
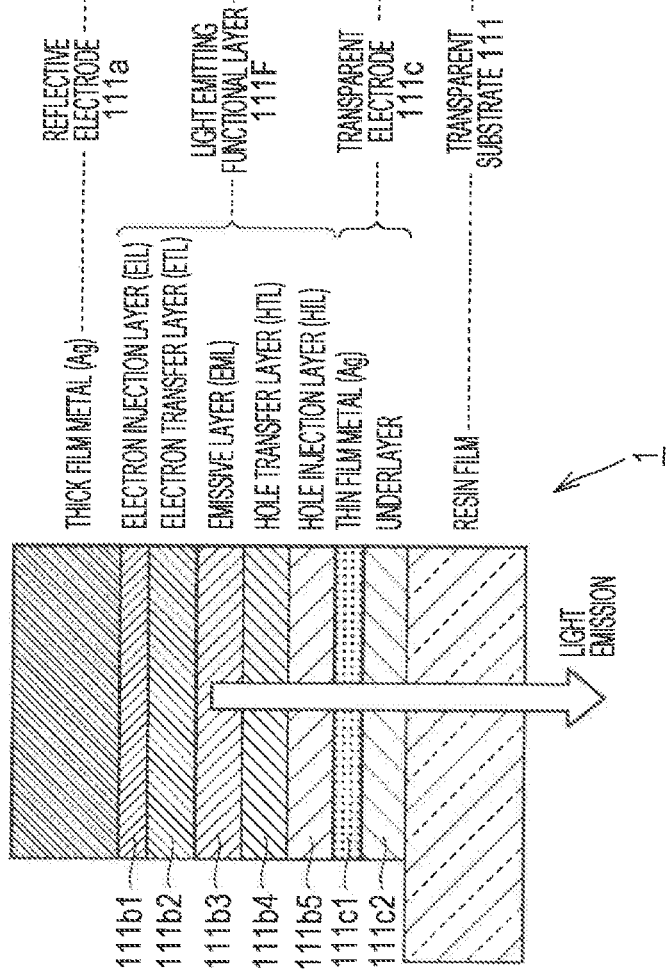
FIG. 2B is a diagram Illustrating an optically equivalent model of the electroluminescent device in the first embodiment.

Next, with reference to FIG. 2, a more specific configuration example of the present embodiment illustrated in FIG. 1 will be described. FIG. 2A is a cross-sectional view illustrating a specific configuration of the electroluminescent device 1 in the present embodiment, and FIG. 2B is a diagram illustrating an optically equivalent model of the electroluminescent device 1 in the present embodiment.

While the electroluminescent device 1 illustrated in FIG. 2 will be described by an organic EL device with emission color of red, the present embodiment is not limited to the organic EL device and can be applied to optically equivalent devices such as an LED and an inorganic EL. In addition, the present invention can also be applied to a device with emission colors of blue or green, in addition to the device with emission color of red.

The organic EL light emitting device is formed by providing a light emitting region on the transparent substrate 101 and thereafter covering with a sealing member (not illustrated) to suppress entry of moisture that would degrade the organic EL. A non-light emitting region having a certain region is provided around the light emitting region in order to maintain the sealing performance. More specifically, the light emitting region further includes the transparent substrate 101/the transparent electrode 111c (anode)/a hole injection layer (HIL) 111b5/a hole transfer layer (HTL) 111b4/an emissive layer (EML) 111b3/an electron transfer layer (ETL) 111b2/an electron injection layer (EIL) 111b1/a reflective electrode 111a.

Other examples include: a region including an anode/an emissive layer/an electron transfer layer/a cathode; a region including an anode/a hole transfer layer/an emissive layer/an electron transfer layer/a cathode; a region including an anode/a hole transfer layer/an emissive layer/a hole blocking layer/an electron transfer layer/an electron transfer layer/ cathode buffer layer/cathode; and a region including an anode/an anode buffer layer/a hole transfer layer/an emissive layer unit/a hole blocking layer/an electron transfer layer/a cathode buffer layer/a cathode, although the present embodiment is not limited to these. It is desirable to use a flexible resin substrate having flexibility as the transparent substrate 101 and the sealing member, and it is preferable to use a material of a transparent member to be described below.

While the electroluminescent device 1 of the present embodiment is a bottom emission type electroluminescent device, it is also allowable to use a top emission type device in which light is emitted toward the sealing member side. The surface emitting panel using the electroluminescent device 1 includes a sealing region for preventing degradation of the light emitting region and a non-light emitting portion in a portion of the light emitting panel in order to provide an electrode for power supply. The light emitting panel having flexibility would have an advantage that it can be arranged along any shape. In addition, the non-light emitting portion having more flexibility than the light emitting portion and being thinner than the light emitting portion would have an advantage that the non-light emitting portion width can be reduced by overlapping in tiling.

While adjusting the coloration of reflected light by overlapping different members as in the conventional technology might lead to a disadvantage of hindering the flexibility, application of the present invention to the electroluminescent device having flexibility would lead to an advantage of capable of controlling the coloration of the reflected light with an integrated configuration with the light emitting layer and maintaining the flexibility. Configurations having an advantage in flexibility in particular is a resin material combined with a thin film metal electrode, or a conductive resin combined with a metal mesh electrode, in which the thickness of the resin substrate is preferably 500 micrometers or less, more desirably 200 micrometer or less.

The bottom emission electroluminescent device 1 illustrated in FIG. 2A can be optically expressed by a simplified model illustrated in FIG. 2B. Herein, an average refractive index of the light emitting functional layer 111F is defined as $n_{EL}$, a thickness of the light emitting functional layer 111F is defined as L, and a distance from the surface of the reflective electrode 111a to the light emitting point is defined as d. As described above, the light emitting point was set to the centroid position of the exciton distribution (herein, the center in the thickness direction of the emissive layer 111b3). In the following, the constituent preconditions of the present embodiment will be described using an optical model of FIG. 2B.

In the electroluminescent device 1 of the present embodiment, the centroid wavelength of energy when all the light emitting units emit light is defined as $\lambda_p$, being referred to as an emission wavelength of the electroluminescent device 1. The organic EL according to the present embodiment includes an absorption peak in the emission wavelength and includes at least one absorption peak in a complementary color region of an emission wavelength in the range of 380 nm to 780 nm, an absolute value of a deviation Δuv of a color coordinate of front reflected light at the time of white color illumination from a blackbody locus is below 0.02, and the refractive index $n_{EL}$, the film thickness L, and the position d of the light emitting point of the light emitting functional layers 111F are determined to satisfy the following Formula (1) when an angle dependence of emission intensity is defined as D(θ).

[Mathematical Expression 4]

$$D(\theta) \geq D(0)\cos\theta \, (0 \leq \theta \leq \theta_D \leq 60 \text{ degrees}) \quad \text{Formula (1)}$$

In the configuration illustrated in FIG. 2B, for example, the position d of the light emitting point is determined by the film thickness of the electron injection layer 111b, the electron transfer layer 111b2, and the emissive layer 111b3, and thus, the position d is included in designing of the film thickness of the light emitting functional layer 111F. With this configuration, it is possible to achieve an electroluminescent device capable of obtaining colorless external light reflection at the time of non-emission while achieving light intensity within a certain angle from the front.

In the present embodiment, the "complementary color region of emission wavelength" is a region close to a color which differs by 180 degrees in hue (H) in the HSV color space defined by CIE. Preferably, when the hue of the emission color is Ho, the hue H of the monochromatic absorption peak wavelength satisfies the following Formula (4).

[Mathematical Expression 5]

$$H_0+180°-60° \leq H \leq H_0+180°+60° \quad \text{Formula (4)}$$

More desirably, it is preferable to satisfy the following Formula (5).

[Mathematical Expression 6]

$$H_0+180°-30° \leq H \leq H_0+180°+30° \quad \text{Formula (5)}$$

Since the hue repeats in units of 360°, the desirable hue H range can be paraphrased as "desirable to be within ±60° from the hue of original hue Ho+180°" in the case of Formula (4). The range can be paraphrased as "more preferable to be within ±30° from the hue being original hue Ho+1800" in the case of Formula (5).

Figure 3:
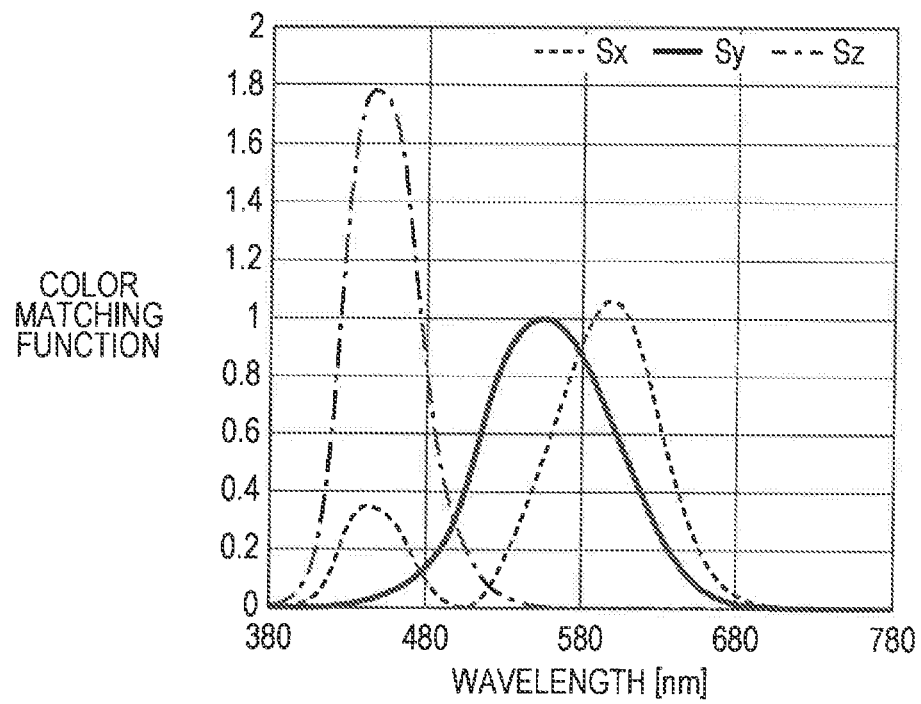
FIG. 3 is a diagram illustrating a relationship between a color matching function and a wavelength.

The xy color coordinate when light is emitted with a certain monochromatic wavelength is calculated from the luminosity factor of a specific wavelength in accordance with the definition of CIE as illustrated in Formula (6). Note that SX, SY and SZ are equal color functions concerning tristimulus values X, Y and Z in the CIE XYZ colorimetric system, and are given as illustrated in FIG. 3.

Herein, λ is the wavelength and defined in units of nanometer. P(λ) is the power spectrum of the light. In calculating the chromaticity at the specific wavelength λo, P(λ) is calculated as P(λ)=σ(λ−λo) using the Dirac σ function in the Formula (6). That is, the chromaticity XYZ of a specific wavelength is calculated as illustrated in Formula (7).

[Mathematical Expression 7]

$$X = \int_{380}^{780} P(\lambda) S_X(\lambda) d\lambda$$

$$Y = \int_{380}^{780} P(\lambda) S_Y(\lambda) d\lambda$$

$$Z = \int_{380}^{780} P(\lambda) S_Z(\lambda) d\lambda \quad \text{Formula (6)}$$

[Mathematical Expression 8]

$$X = S_X(\lambda_0), \, Y = S_Y(\lambda_0), \, Z = S_Z(\lambda_0) \quad \text{Formula (7)}$$

Using tristimulus values XYZ, the RGB values in the sRGB color space are calculated as in Formula (8).

[Mathematical Expression 9]

$$\begin{cases} R = 3.2410X - 1.5374Y - 0.4986Z \\ G = -0.9692X + 1.8760Y + 0.0416Z \\ B = 0.0556X - 0.2040Y + 1.0570Z \end{cases} \quad \text{Formula (8)}$$

Furthermore, the HSV value is calculated as illustrated in Formula (9) using RGB values.

[Mathematical Expression 10]

$$H = \begin{cases} 60° \times \dfrac{G-B}{Max-Min} & (Max = R) \\ 60° \times \dfrac{B-R}{Max-Min} + 120° & (Max = G) \\ 60° \times \dfrac{R-G}{Max-Min} + 240° & (Max = B) \end{cases} \quad \text{Formula (9)}$$

$$S = \begin{cases} 0 & (Max = 0) \\ \dfrac{Max-Min}{Max} + 240° & (Max \neq 0) \end{cases}$$

$$V = Max$$
$$Max = \max(R, G, B)$$
$$Min = \min(R, G, B)$$

Figure 4:
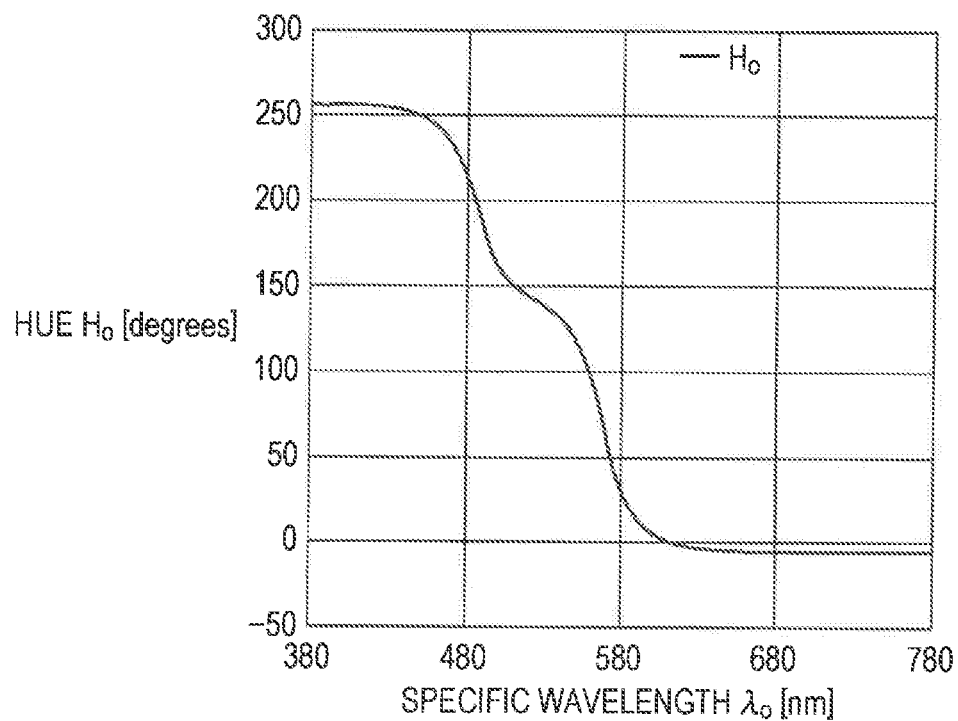
FIG. 4 is a diagram illustrating a relationship of a hue $H_0$ to a specific wavelength $\lambda_0$.

Herein, max is a function that gives the maximum one within the parentheses, and min is a function that gives the minimum within the parentheses. Once the wavelength is given in this manner, the HSV value can be uniquely defined. FIG. 4 illustrates the calculation result of the hue H from the wavelength.

In this manner, it can be seen that the hue H can be uniquely defined from the specific wavelength λo. Conversely, when obtaining the hue H from FIG. 4, it is observed that the specific wavelength λo can be uniquely defined in the range of −6.2°≤H≤256.3°.

Figure 5:
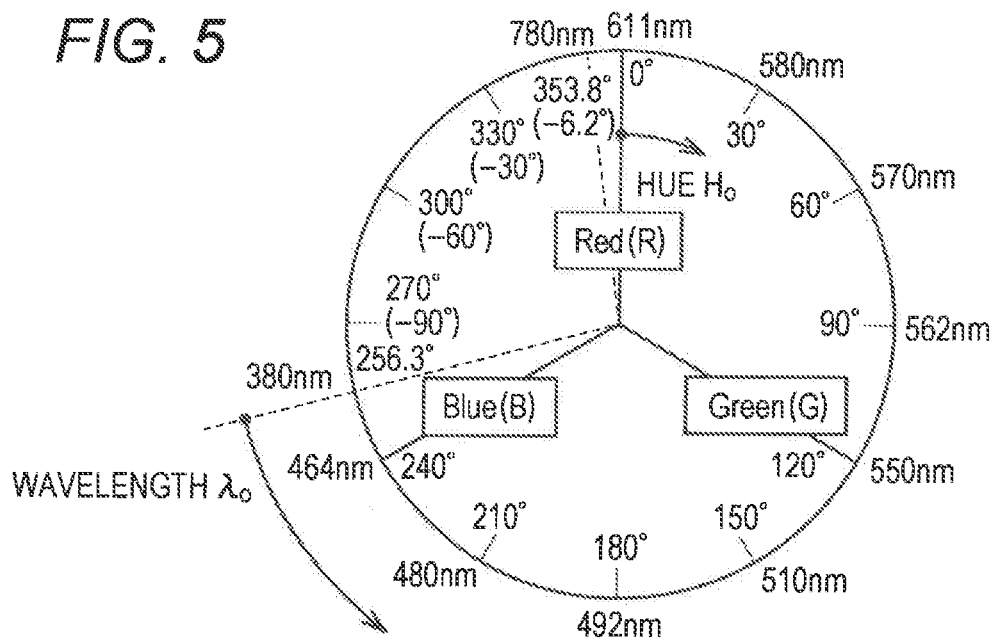
FIG. 5 is a diagram Illustrating a relationship between light of specific wavelength $\lambda_0$ and hue $H_0$.

Meanwhile, when the hue exceeds this range, the hue cannot be defined at a specific wavelength. This is because there is no monochromatic light on the chromaticity tied between R and B of sRGB. This state is illustrated in FIG. 5. In this case, complementary colors can be achieved by using two wavelengths of blue (wavelength 380 nm to 480 nm) and red (wavelength 580 nm to 780 nm).

Figure 6:
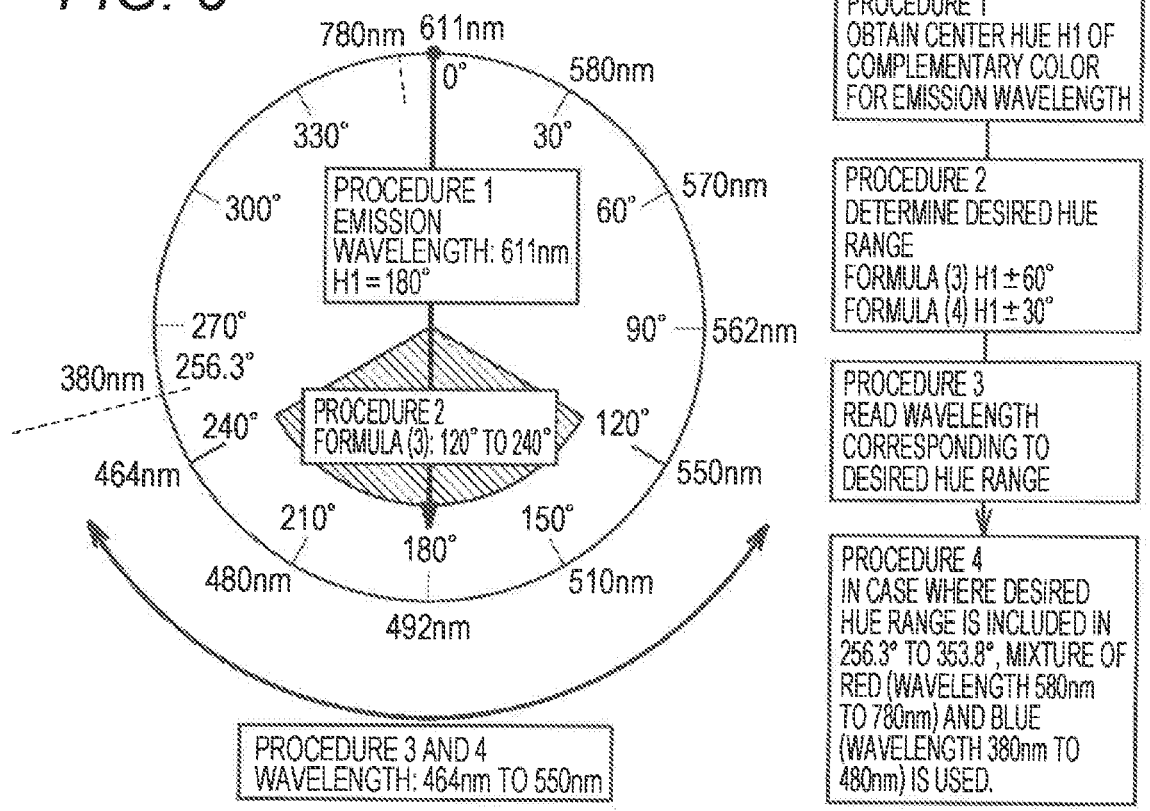
FIG. 6 is a diagram illustrating a procedure for determining wavelength ranges of complementary colors.

A procedure for finding the above complementary colors is illustrated in FIG. 6. In addition, the wavelength range of complementary colors determined by this procedure is as illustrated in FIG. 7 based on Formula (4). The wavelength range is as illustrated in FIG. 8 based on Formula (5). In this manner, the wavelength range corresponding to "complementary color region of emission wavelength" can be defined.

Next, preconditions for the film thickness and the position of the light emitting point desired in the present embodiment will be described using a more specific design example. FIG. 9 illustrates a specific optical design table of the electroluminescent device 1 with emission color of red illustrated in FIG. 2A. The transparent electrode 111c has a configuration in which an underlayer 111c2 for enhancing smoothness of the thin film metal and a thin film metal 111c1 are stacked in order from the transparent substrate 101 side.

With this configuration, it is possible to form the transparent electrode 111c with less absorption. In addition, a refractive index of each of a plurality of functional layers at wavelengths corresponding to blue, green, and red is illustrated. In the optical configuration illustrated in FIG. 9, the configuration of the present embodiment can be achieved with a configuration in which the film thickness L of the light emitting functional layer 111F and the distance d from the surface of the reflective electrode 111a of the light emitting point meet the preconditions of the present embodiment.

Configuration positions meeting the preconditions of the present embodiment was examined by calculation while changing the film thickness L of the light emitting functional layer 111F and the distance d of the light emitting point from the surface of the reflective electrode 111a. Calculation of emission intensity and reflectance is designed using an analysis method of optical multilayer film. As a calculation method, the method described in Chapter 5, Section 1 of a known Literature (Koutaro Kajikawa et al., "Active Plasmonics", Tokyo, Corona Publishing, first edition first press, 2013, pages 151 to 159) was used. In addition to this, it is also possible to use a known electromagnetic field analysis method such as a finite difference time domain (FDTD) method, a finite element method, and a transfer matrix method.

In addition, in order to calculate the emission spectrum of the device, the internal emission spectrum of the emissive layer is inversely calculated by using the electroluminescence spectrum (EL spectrum) at the time of current injection of a reference device so as to precisely estimate the emission spectrum at the time of current injection in calculation.

The internal emission spectrum inversely calculated from the electroluminescence spectrum of the reference device and from light extraction efficiency of the reference device in this manner had a light spectrum having a peak wavelength at a wavelength of 625 nm with a full width at half maximum value of 70 nm. The emission wavelength λo obtained from the centroid of the energy spectrum was 660 nm.

In this manner, the method of estimating the internal spectrum using the current injection spectrum of the reference device is advantageous in its capability of more precisely estimating the internal spectrum at the time of current injection, as compared with the method of estimating the internal emission spectrum using the photoluminescence spectrum of the material.

Hereinafter, a result of a desirable design of the present embodiment focusing on the emission wavelength of 660 nm will be described. As illustrated in FIG. 7, the wavelength λc of the complementary color region corresponding to the emission wavelength 660 nm is expressed by Formulas (10) and (11).

[Mathematical Expression 11]

$$469 \text{ nm} \leq \lambda_c \leq 552 \text{ nm (based on Formula (4))} \quad \text{Formula (10)}$$

[Mathematical Expression 12]

$$483 \text{ nm} \leq \lambda_c \leq 518 \text{ nm (based on Formula (5))} \quad \text{Formula (11)}$$

Particularly, with reference to FIG. 4, the hue of emission color can be regarded as substantially 0 degree in the device with emission color of red (wavelength 580 nm to 780 nm), the complementary color range is preferably set to the range of Formulas (12) and (13).

[Mathematical Expression 13]

$$464 \text{ nm} \leq \lambda_c \leq 550 \text{ nm (based on Formula (4))} \quad \text{Formula (12)}$$

[Mathematical Expression 14]

$$480 \text{ nm} \leq \lambda_c \leq 510 \text{ nm (based on Formula (5))} \quad \text{Formula (13)}$$

With this setting, it is possible to easily set the wavelength range of complementary colors of the electroluminescent device with emission color of red (wavelength 580 nm to 780 nm).

Figure 10:
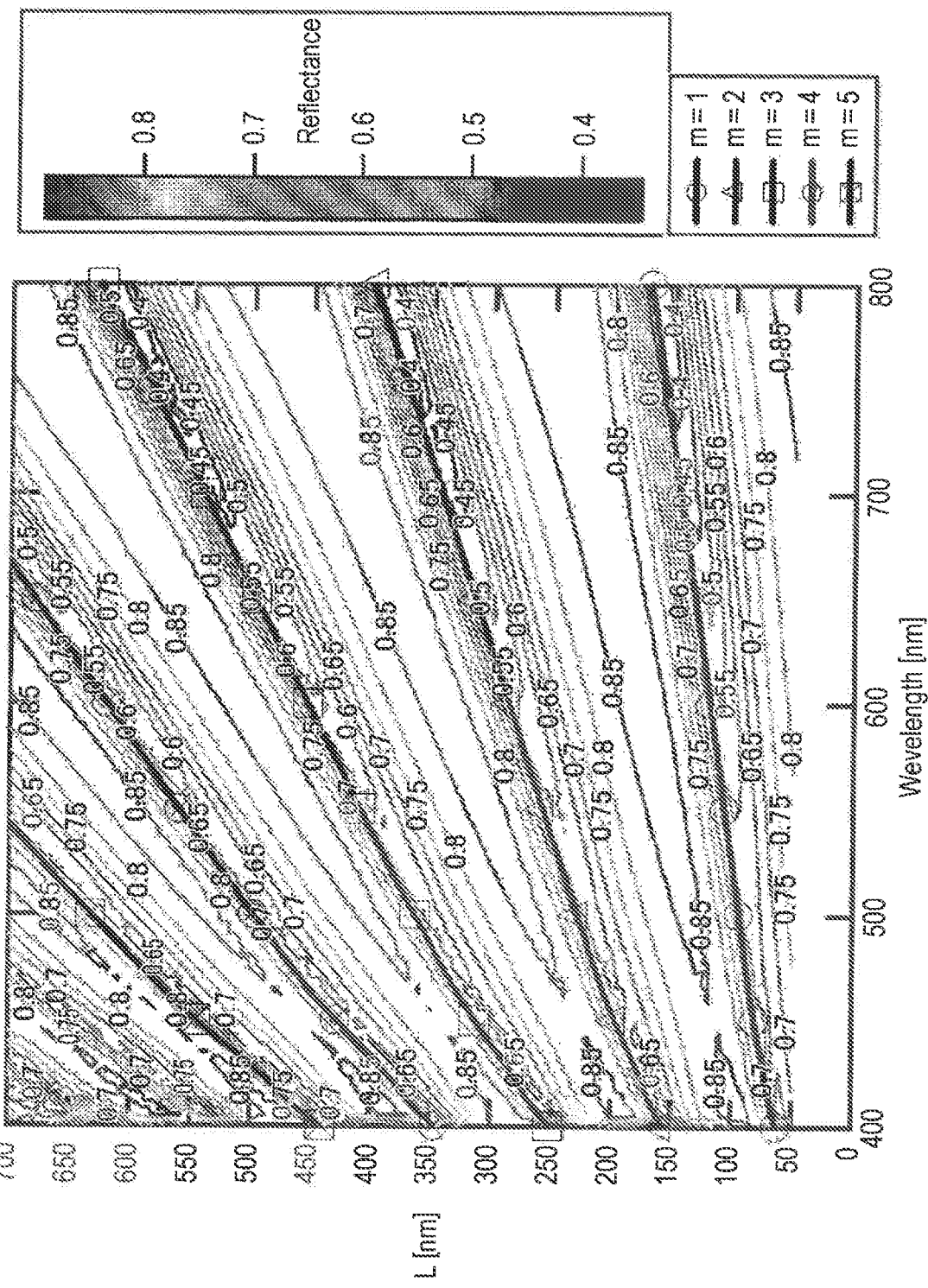
FIG. 10 is a diagram illustrating wavelength dependence of a front reflectance on the film thickness of a light emitting functional layer.

FIG. 10 illustrates a result of examining the front reflectance with respect to the film thickness L of the light emitting functional layer 111F. In addition, FIG. 10 includes an overlapped graph illustrating conditions for causing resonance absorption, calculated using Formula (3).

It can be confirmed from FIG. 10 that the condition of Formula (3) represents the condition for mutually weakening reflected light. A condition for allowing the absorption peak of Formula (3) to be included in the wavelength region of complementary color is obtained. The wavelength range of the complementary color obtained by Formula (4) or Formula (5) is defined as $\lambda min \leq \lambda c \leq \lambda max$. At this time, the condition for allowing the absorption peak of Formula (3) to be included in the wavelength region of the complementary color is represented by Formula (14).

[Mathematical Expression 15]

$$\frac{\lambda_{min}}{2n_{EL}(\lambda_{min})}\left(m - \frac{\phi_m(\lambda_{min}) + \phi_a(\lambda_{min})}{2\pi}\right) \leq$$
$$L \leq \frac{\lambda_{max}}{2n_{EL}(\lambda_{max})}\left(m - \frac{\phi_m(\lambda_{max}) + \phi_a(\lambda_{max})}{2\pi}\right)$$

Formula (14)

$n_{EL}(\lambda)$ represents the refractive index of the light emitting functional layer 111F at the specific wavelength $\lambda$. $\phi_m(\lambda)$ represents a phase change at the time of light reflection on the reflective electrode 111a. $\phi_a(\lambda)$ represents a phase change at the time of light reflection at the transparent electrode 111c. m is a natural number (1, 2, 3, . . . ).

In the present embodiment, the film thickness L is set so as to satisfy the condition of Formula (14) with any natural number m. With this setting, it is possible to satisfy the condition that "at least one absorption peak is included in a complementary color region of an emission wavelength in the range of 380 nm to 780 nm," as the precondition of the present embodiment.

Next, conditions for including the absorption peak in the emission wavelength $\lambda$o will be described. Similarly to the notion about complementary colors, the hue Ha of the absorption wavelength when the hue of the emission wavelength is defined as Ho can be expressed by the following Formula (15).

[Mathematical Expression 16]

$$H_o - 60° \leq H_a \leq H_o + 60°$$

Formula (15)

It would be more desirable that the condition of Formula (16) be satisfied.

[Mathematical Expression 17]

$$H_o - 30° \leq H \leq H_o + 30°$$

Formula (16)

Since the hue repeats in units of 360°, the desirable hue H range can be paraphrased as "desirable to be within ±60° from the original hue Ho" in the case of Formula (15). The range can be paraphrased as "more preferable to be within ±30° from the original hue Ho" in the case of Formula (16).

As described below, it is possible to obtain a region of the desired absorption wavelength $\lambda$a corresponding to the emission wavelength using FIGS. 4 to 6.

Since the light emitting device has an emission wavelength $\lambda$o of 660 nm this time, the wavelength range of a desirable absorption peak can be represented by Formulas (17) and (18).

[Mathematical Expression 18]

$$572 \text{ nm} \leq \lambda_a \leq 780 \text{ nm (based on Formula (15))}$$

Formula (17)

[Mathematical Expression 19]

$$582 \text{ nm} \leq \lambda_a \leq 780 \text{ nm (based on Formula (16))}$$

Formula (18)

Since the hue of emission color can be regarded as substantially 0° from FIG. 4 in the device with emission color of red (wavelength 580 nm to 780 nm) in particular, the wavelength range of a desirable absorption peak can be represented by Formulas (19) and (20).

[Mathematical Expression 20]

$$570 \text{ nm} \leq \lambda_a \leq 780 \text{ nm (based on Formula (15))}$$

Formula (19)

[Mathematical Expression 21]

$$580 \text{ nm} \leq \lambda_a \leq 780 \text{ nm (based on Formula (16))}$$

Formula (20)

The desirable range of the absorption peak wavelength corresponding to the emission wavelength $\lambda$o can be expressed by the Formula (22) having the wavelength range obtained by the Formula (15) or (16) as the Formula (21).

[Mathematical Expression 22]

$$\lambda_{min\_o} \leq \lambda \leq \lambda_{max\_o}$$

Formula (21)

[Mathematical Expression 23]

$$\frac{\lambda_{min\_o}}{2n_{EL}(\lambda_{min\_o})}\left(p - \frac{\phi_m(\lambda_{min\_o}) + \phi_a(\lambda_{min\_o})}{2\pi}\right) \leq$$
$$L \leq \frac{\lambda_{max\_o}}{2n_{EL}(\lambda_{max\_o})}\left(p - \frac{\phi_m(\lambda_{max\_o}) + \phi_a(\lambda_{max\_o})}{2\pi}\right)$$

Formula (22)

where, p is a natural number (1, 2, 3 . . . ).

Description above is the conditions in the first embodiment to achieve "the electroluminescent device emitting light of a single color and having a plurality of functional layers, in which an absorption peak is included in the emission wavelength and at least one absorption peak is included in a complementary color region of an emission wavelength in the range of 380 nm to 780 nm". Now, the following are summaries of devices with emission color of red (wavelength 580 nm to 780 nm) in particular. A desirable configuration for achieving the preconditions of the present embodiment is as follows.

All of the following (condition 1), (condition 2) and (condition 3) shall be satisfied.
(Condition 1)
The combination of wavelength ranges shall be any of the following [1], [2], and [3].
(Condition 1)

[Mathematical Expression 24]

$\lambda_{min}$=464 nm, $\lambda_{max}$=550 nm, $\lambda_{min\_0}$=570 nm,
   $\lambda_{max\_0}$=780 nm [1]

$\lambda_{min}$=480 nm, $\lambda_{max}$=510 nm, $\lambda_{min\_0}$=580 nm,
   $\lambda_{max\_0}$=780 nm [2]

Based on Formulas (4), (5), (15), and (16) [3]

(Condition 2)
When the wavelength range of the complementary color of the emission wavelength $\lambda$o is defined as $\lambda min \leq \lambda \leq \lambda max$, the following Formula (23) needs to be satisfied for any natural number m.

[Mathematical Expression 25]

$$\frac{\lambda_{min}}{2n_{EL}(\lambda_{min})}\left(m - \frac{\phi_m(\lambda_{min}) + \phi_a(\lambda_{min})}{2\pi}\right) \leq$$
$$L \leq \frac{\lambda_{max}}{2n_{EL}(\lambda_{max})}\left(m - \frac{\phi_m(\lambda_{max}) + \phi_a(\lambda_{max})}{2\pi}\right)$$
Formula (23)

(Condition 3)

When the wavelength range of the color close to the emission wavelength λo is defined as $\lambda_{min_0} \leq \lambda \leq \lambda_{max_0}$, the following Formula (24) needs to be satisfied for any natural number p.

[Mathematical Expression 26]

$$\frac{\lambda_{min\_o}}{2n_{EL}(\lambda_{min\_o})}\left(p - \frac{\phi_m(\lambda_{min\_o}) + \phi_a(\lambda_{min\_o})}{2\pi}\right) \leq$$
$$L \leq \frac{\lambda_{max\_o}}{2n_{EL}(\lambda_{max\_o})}\left(p - \frac{\phi_m(\lambda_{max\_o}) + \phi_a(\lambda_{max\_o})}{2\pi}\right)$$
Formula (24)

The above conditions for the electroluminescent device with emission color of red in FIG. 9 is calculated.
(Condition 1)
The wavelength range [3] is adopted.

[Mathematical Expression 27]

$\lambda_{min}$=469 nm, $\lambda_{max}$=552 nm, $\lambda_{min\_0}$=572 nm, $\lambda_{max\_0}$=780 nm    Formula (25)

(Condition 2)

[Mathematical Expression 28]

$$\frac{469 \text{ nm}}{2n_{EL}(469 \text{ nm})}\left(m - \frac{\phi_m(469 \text{ nm}) + \phi_a(469 \text{ nm})}{2\pi}\right) \leq L \leq$$
$$\frac{552 \text{ nm}}{2n_{EL}(552 \text{ nm})}\left(m - \frac{\phi_m(552 \text{ nm}) + \phi_a(552 \text{ nm})}{2\pi}\right) \Rightarrow$$
$$124.0 \times (m - 0.30) \leq L \leq 152.9 \times (m - 0.29)$$
Formula (26)

An example of the plurality of m is as follows.

87 nm≤L≤108 nm (m=1)

211 nm≤L≤261 nm (m=2)

335 nm≤L≤414 nm (m=3)

459 nm≤L≤567 nm (m=4)

583 nm≤L≤720 nm (m=5)

(Condition 3)
An example of the plurality of p is as follows.

[Mathematical Expression 29]

$$\frac{572 \text{ nm}}{2n_{EL}(572 \text{ nm})}\left(p - \frac{\phi_m(572 \text{ nm}) + \phi_a(572 \text{ nm})}{2\pi}\right) \leq L \leq$$
$$\frac{780 \text{ nm}}{2n_{EL}(780 \text{ nm})}\left(p - \frac{\phi_m(780 \text{ nm}) + \phi_a(780 \text{ nm})}{2\pi}\right) \Rightarrow$$
$$157.7 \times (p - 0.29) \leq L \leq 222.2 \times (p - 0.25)$$
Formula (27)

112 nm≤L≤166 nm (p=1)

270 nm≤L≤388 nm (p=2)

427 nm≤L≤610 nm (p=3)

585 nm≤L≤833 nm (p=4)

742 nm≤L≤1054 nm (p=5)

A film thickness range satisfying all of (Condition 1) to (Condition 3)

335 nm≤L≤388 nm (m=3, p=2)    (a)

459 nm≤L≤567 m (m=4, p=3)    (b)

585 nm≤L≤720 nm (m=5, p=4)    (c)

Figure 11:
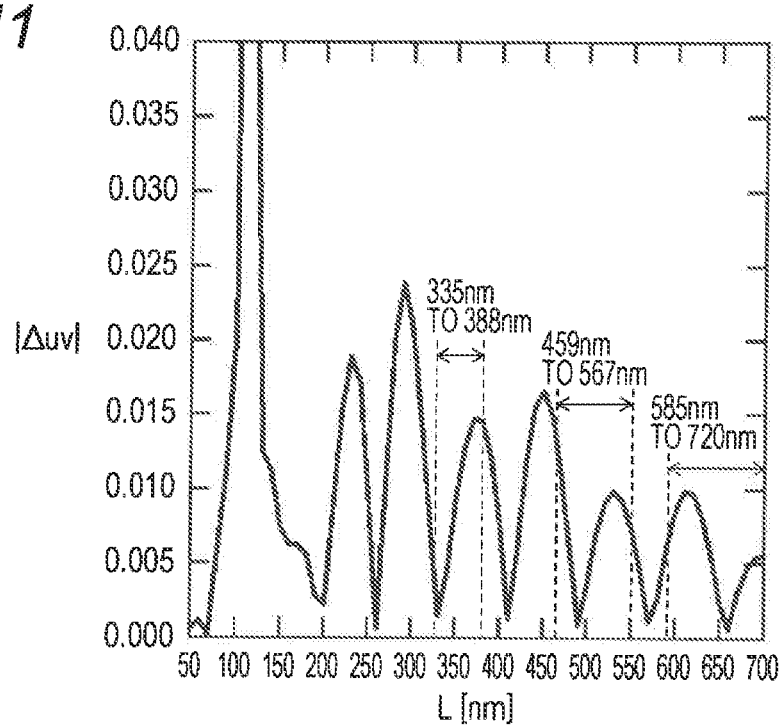
FIG. 11 is a diagram illustrating an absolute value of a deviation Δuv of a color coordinate of front reflected light from a blackbody locus with respect to the film thickness of the light emitting functional layer.

Next, a result of calculation of deviation of the color coordinate of the front reflected light during white color illumination from the blackbody radiation line is illustrated in FIG. 11. FIG. 11 is a graph illustrating a result of calculating the spectrum when standard light having a color temperature of 6500K is emitted with respect to the front reflectance of FIG. 10 and calculating the absolute value of the deviation Δuv from the blackbody locus in accordance with the definition of CIE.

It can be seen from FIG. 11 that the film thickness L of the light emitting functional layer 111F at which the absolute value of the deviation Δuv from the blackbody locus is below 0.02 overlaps with the "film thickness range satisfying all of (Condition 1) to (Condition 3)". Accordingly, it can be confirmed that a configuration having "at least one absorption peak in the complementary color region of the emission wavelength in the wavelength range of 380 nm to 780 nm" would be advantageous to achieve "the absolute value of the deviation Δuv of the color coordinate of the front reflected light at white color illumination from the blackbody locus being below 0.02. Furthermore, it is desirable that the deviation Δuv of the color coordinate of the front reflected light from the blackbody locus be 0.015 or less, more desirably 0.010 or less. With this range, the external light reflection viewed from the front becomes colorless, making it possible to allow the outside to easily perform visual recognition of color information when the device emits light.

Next, the film thickness L of the light emitting functional layer 111F is fixed to the film thickness L=335 nm at which the absolute value of the deviation Δuv obtained earlier is below 0.02, and the condition to achieve the precondition of the present embodiment, that is, "D(θ)≥D(0)cos θ (0≤θ≤$\theta_D$=20)" holds when the angle dependence of light intensity is defined as D(θ)" was examined while changing the distance d from the surface of the reflective electrode 111a to the light emitting point.

Herein, the specific angle 8O=20 degrees. With this configuration, it is possible to achieve an electroluminescent device capable of obtaining colorless external light reflection at the time of non-emission while achieving luminance within the angle 20 degrees from the front. As the light intensity, luminance weighted by luminosity factor was used. When the following Formula (28) holds, the distance d from the surface of the reflective electrode 111a to the light emitting point is found out to be "D(θ)≥D(0)cos θ(0≤θ≤$\theta_D$=20) in the case where the angle dependence of light intensity is defined as D(θ)".

[Mathematical Expression 30]

10 nm≤d≤150 nm, or 190 nm≤d≤300 nm    Formula (28)

In addition, the distanced from the surface of the reflective electrode 111a to the light emitting point is desirably a film thickness that maximizes the emission luminance in order to achieve an energy-saving device with increased luminous efficiency. Here adopted was the film thickness d=70 nm that maximizes the emission luminance while satisfying the conditions. With this setting of the film thickness (L=335 nm, d=70 nm), the preconditions of the present embodiment can be achieved.

In summary, the electroluminescent device 1 according to first embodiment has a configuration in which the film thickness L of the light emitting functional layer 111F and the distanced from the reflective electrode 111a to the light emitting point are set to achieve the precondition of "including an absorption peak in the emission wavelength and including at least one absorption peak in a complementary color region of an emission wavelength in the range of 380 nm to 780 nm, an absolute value of a deviation Δuv of a color coordinate of front reflected light at the time of white color illumination from a blackbody locus is below 0.02, and a refractive index and a film thickness of each of the plurality of functional layers are determined to satisfy the formula $D(\theta) \geq D(0)\cos\theta$ ($0 \leq \theta \leq \theta_D \leq 60$ degrees) when an angle dependence of emission intensity is defined as $D(\theta)$. This makes it possible to achieve an electroluminescent device capable of achieving intensity at an angle within a specific range from the front while suppressing color shift at the time of reflection of external light.

Second Embodiment

In the second embodiment, the angle setting is changed to $\theta_D=30°$ from the first embodiment. The present embodiment is characterized by "$D(\theta) \geq D(0)\cos\theta$ ($0 \leq \theta \leq \theta_D = 60°$) is satisfied in a case where the angle dependence of the emission intensity when all the units are simultaneously caused to emit light is defined as $D(\theta)$)". How the specific angle $\theta_D$ is determined will be described as follows.

It is sometimes determined by laws and regulations. Safety Standards of the Road Transport Vehicle (Ordinance of the Ministry of Transport No. 67 of Jul. 28, 1954 and Amended Ordinance of the Ministry of Land, Infrastructure, Transport and Tourism No. 3 of Jan. 22, 2015) and relevant notification include angular characteristics required for the headlamps etc. of the car. In a case where the electroluminescent device is applied to a front light, a front fog lamp, a side irradiation light, a side irradiation light at the time of low speed, a car width light, a front upper end light, a side light, a number light, a rear light, a rear fog lamp, a parking light, a rear upper end light, a brake light, an auxiliary brake light, a backward light, a direction Indicator, an auxiliary direction Indicator, an emergency flashing indicator light, an emergency braking indicator light, and a rear-end collision warning indicator lamp, etc., there is a need to obtain a luminance value having a specific range of at least a specific angle $\theta_D$ or less.

The specific angle $\theta_D$ can be defined from the angular range that can be perceived by human eyes. It is important that lighting (traffic signals, signal lamps, car tail lamps, etc.) that is supposed to be seen by a human can obtain a specific luminance at least in an angular range that can be viewed by humans. There is a general conception that human visual sense is such that "the effective visual field with excellent information receiving capability is only 30 degrees horizontally and 20 degrees vertically, and the stable fixation field allowing prompt stabilization of a point of fixation is horizontally 60 to 90 degrees, vertically 45 to 70 degrees" [1] (http://www.lab.ime.cmc.osaka-u.ac.jp/~kiyo/cr/kiyokawa-2002-03-Hikari-Report/kiyokawa-2002-03-Hikari-Report-.pdf). With the angle setting of $\theta_D=30$ degrees, it is possible to transmit information that the signal is lit within a range of an effective field of view excellent in information receiving capability at bright angle ranges.

Third Embodiment

The third embodiment is characterized in that two or more light emitting units with emission color of red are vertically stacked, and the maximum intensity angle in the angle dependence of the emission intensity at emission in each of units is mutually different, and having at least one absorption peak in each of green and blue regions. Herein, "emission color of red" means that the centroid wavelength (emission wavelength) of the emission energy is included in the range of 580 nm or more and below 780 nm, and desirably chromaticity x at emission is 0.5 or more. Moreover, the "blue region" means a region having a wavelength of 380 nm or more and below 490 nm, while the "green region" means a region of a wavelength of 490 nm or more and below 580 nm.

Figure 12:
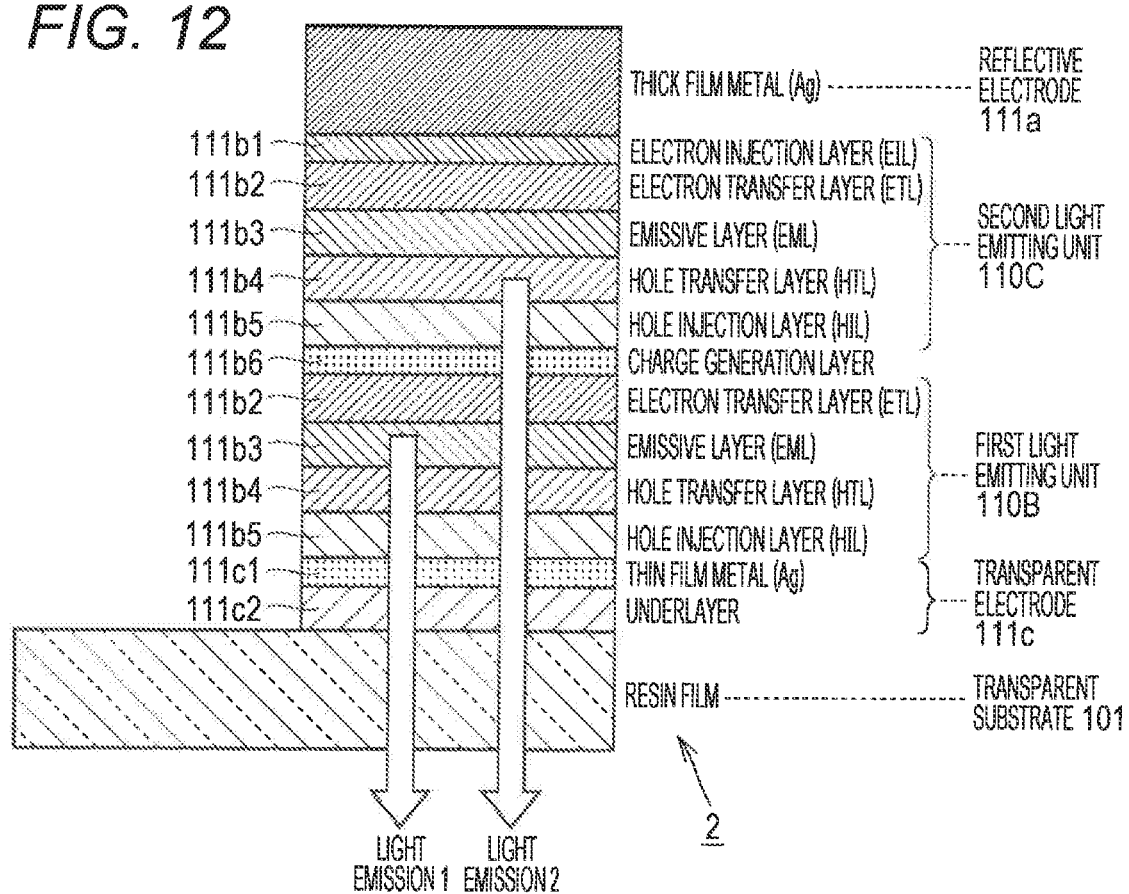
FIG. 12 is a diagram illustrating a cross-sectional structure of an electroluminescent device in the third embodiment.
Figure 13:
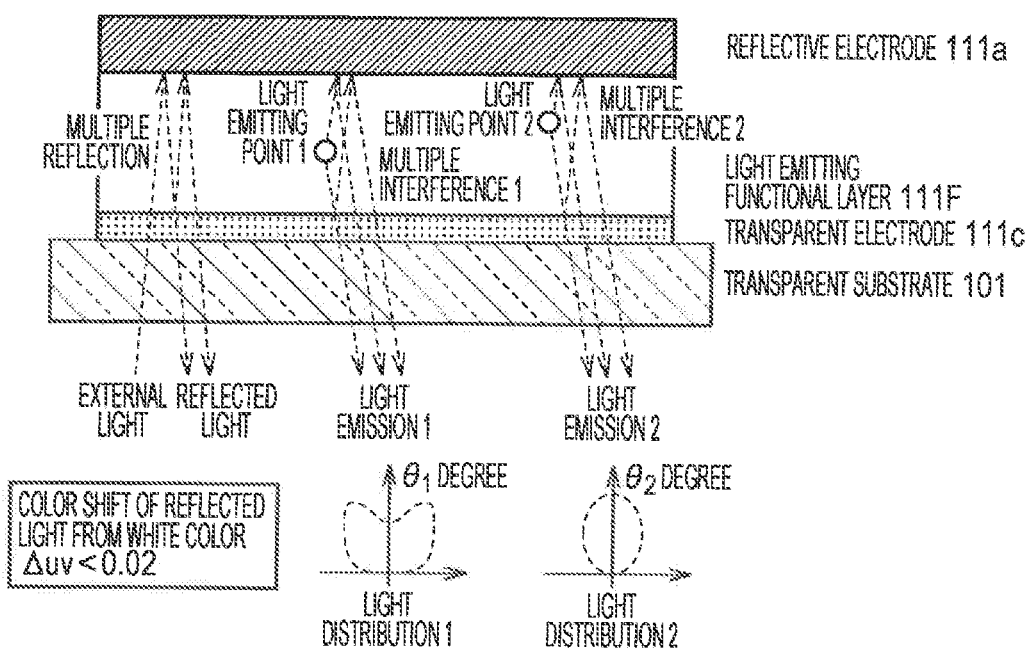
FIG. 13 is a diagram illustrating an optically equivalent model of the electroluminescent device in the third embodiment.

FIG. 12 illustrates a cross-sectional structure of an electroluminescent device 2 of the present embodiment. The electroluminescent device 2 is formed by vertically stacking a first light emitting unit 110B and a second light emitting unit 110C. FIG. 13 illustrates an optically equivalent schematic view of FIG. 12. The configuration of each of the light emitting units is similar to the case of the first embodiment.

In the electroluminescent device 2 of the present embodiment, the maximum intensity angle in the angle dependence of the emission intensity at light emission in each of the light emitting units is set to mutually different angle. In addition, the total film thickness of the light emitting functional layer 111F in which the light emitting units are stacked is set to satisfy the condition that the absolute value of the deviation Δuv of the reflected light of the standard light (D65) from the blackbody locus is below 0.02. This configuration makes it possible to achieve a light emitting device which is capable of achieving intensity in a specific angular range, in particular in the red, with colorless external light reflection at the time of non-emission.

Fourth Embodiment

Figure 14A:
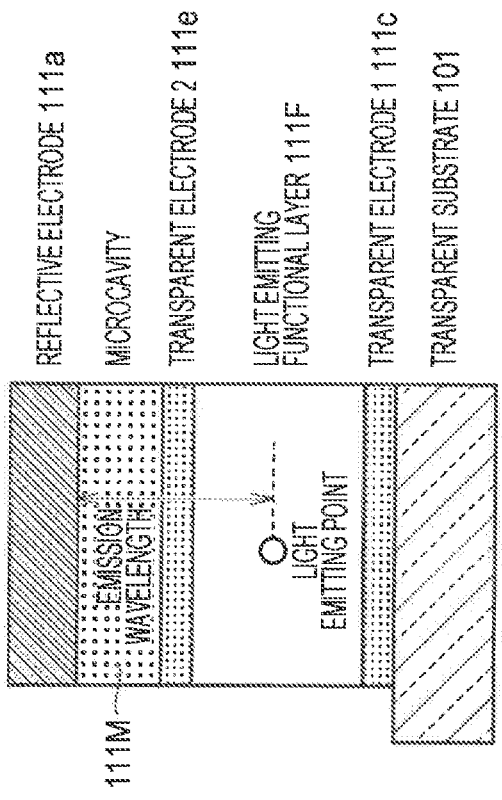
FIG. 14A illustrates an electroluminescent device including a microcavity on the transparent substrate side and FIG. 14B illustrates an electroluminescent device including a microcavity on the reflective electrode side.
Figure 14B:
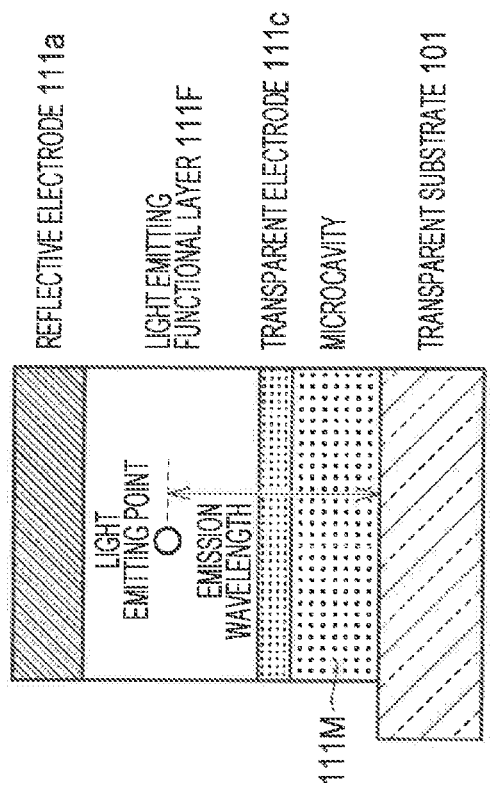

FIG. 14 illustrates an optically equivalent model of electroluminescent devices 4A and 4B according to a fourth embodiment. FIG. 14A illustrates the electroluminescent device 4A including a microcavity 111M on the transparent substrate 101 side, while FIG. 14B illustrates an electroluminescent device 4B including a microcavity 111M on the reflective electrode 111a side.

The electroluminescent device 4 of the present embodiment includes at least one microcavity 111M within a distance of the emission wavelength from the light emitting point. The microcavity 111M includes "a dielectric multilayer film including a stack of multiple layers of dielectrics having mutually different refractive indexes in the emission wavelength", "a negative dielectric/a positive dielectric/a negative dielectric", or a photonic crystal.

With at least one microcavity within the distance of the emission wavelength from the light emitting point, it is possible to reduce color shift at white light reflection at light-off while ensuring the emission intensity within a specific angular range from the front.

In particular, the use of a dielectric multilayer film leads to an advantage of achieving a design with less absorption. In the case of using a photonic crystal, there is an advantage of being able to control so as to increase the front intensity or direct light to a specific angle. The case of using "a negative dielectric/a positive dielectric/a negative dielectric" will be described below in a fifth embodiment.

In the present embodiment, it is more preferable that the number of light emitting points is not limited to one, that is, preferably more than one. In particular, as illustrated in the third embodiment, it is desirable to configure in which "two or more light emitting units are vertically stacked, and the maximum intensity angle in the angle dependence of the emission intensity at light emission in each of light emitting units is mutually different". With this configuration, it is easy to ensure the emission intensity within a specific angular range from the front while suppressing the color shift of the reflected light of the white light at the time light-off.

Figure 15B:
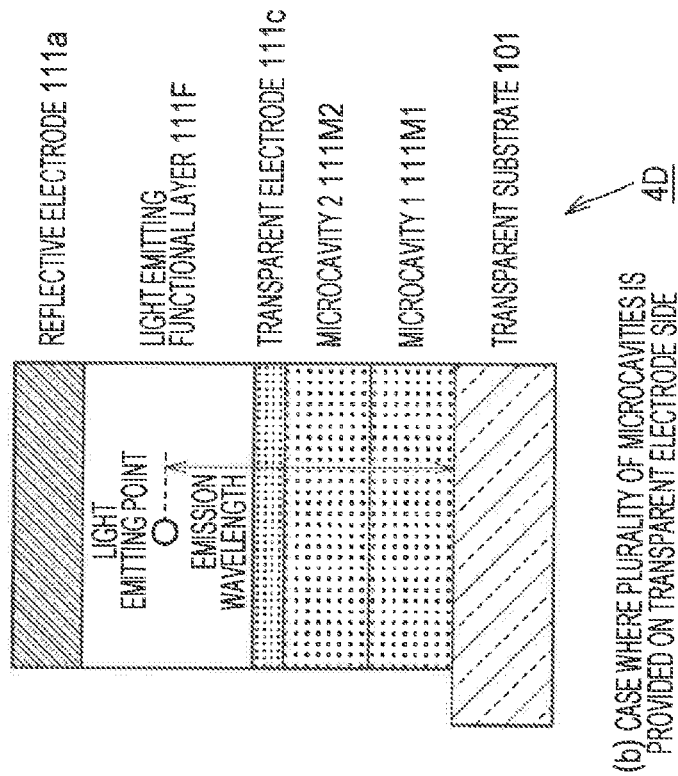
FIG. 15B illustrates an electroluminescent device including a microcavity in two layers on the transparent substrate side.
Figure 15A:
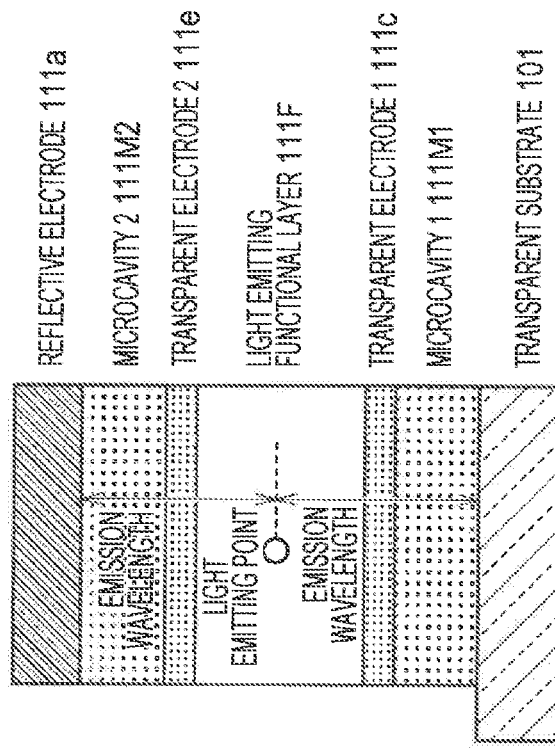
FIG. 15A illustrates an electroluminescent device including a microcavity on both the transparent substrate side and the reflective electrode side.

FIG. 15 illustrates optically equivalent models of electroluminescent devices 4C and 4D according to another aspect of the present embodiment. FIG. 15A Illustrates an electroluminescent device 4C including microcavities 111M1 and 111M2 on both of the transparent substrate 101 side and the reflective electrode 111a side. FIG. 15B illustrates the electroluminescent device 4D including microcavities 111M1 and 111M2 in two layers on the transparent substrate 101 side. Even in this configuration, equivalent operational effects can be obtained.

In addition, with two microcavities provided like this, it is possible to enhance an effect of obtaining white reflected light and an effect of controlling light distribution compared with the case having one microcavity. For example, it is desirable that the microcavity 111M1 on the transparent substrate side in FIG. 15A be configured to resonate in the wavelength region of the emission wavelength, and that the microcavity 111M2 on the reflection layer side is configured to resonate in the wavelength region of complementary color of the emission wavelength. This configuration is advantageous in that the state density of light in the emission wavelength in the microcavity 111M1 increases on the substrate side leading to enhancement of the front luminance and that it is possible to correct the color shift from the white color of the reflected light by the microcavity 111M2 on the reflection layer side.

Fifth Embodiment

Figure 16A:
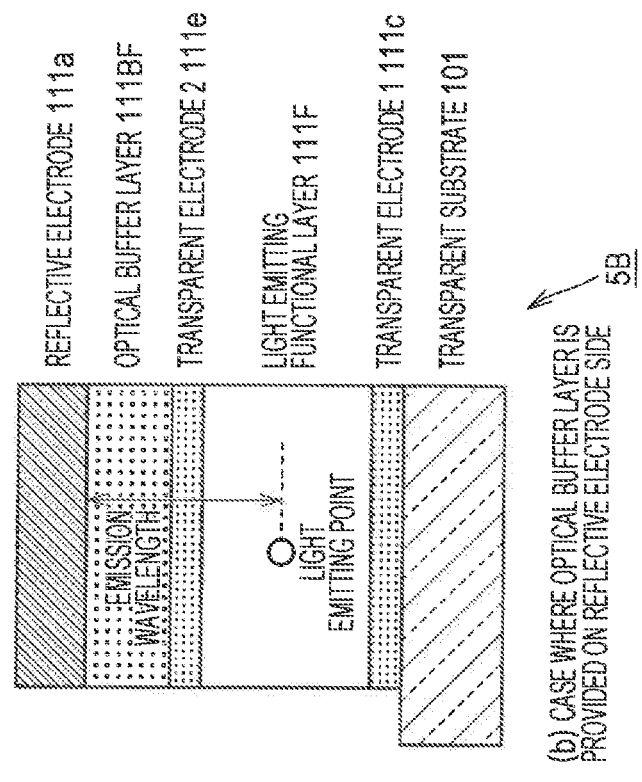
FIG. 16A illustrates an electroluminescent device including an optical buffer layer on the transparent substrate side and FIG. 16B illustrates an electroluminescent device including an optical buffer layer on the reflective electrode side.
Figure 16B:
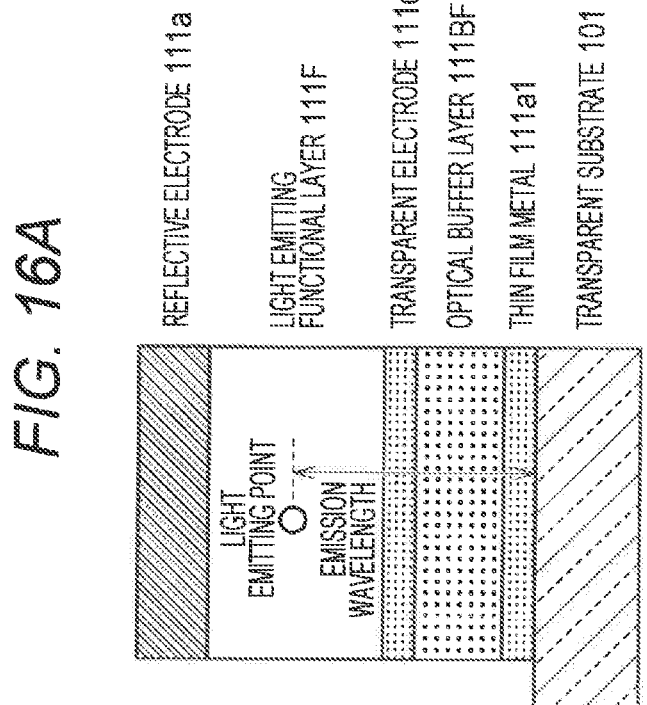

FIG. 16 illustrates an optically equivalent model of electroluminescent devices 5A and 5B according to a fifth embodiment. FIG. 16A illustrates an electroluminescent device 5A including an optical buffer layer 111BF on the transparent substrate 101 side. FIG. 16B illustrates an electroluminescent device 5B including the optical buffer layer 111BF on the reflective electrode 111a side.

The electroluminescent devices 5A and 5B in the present embodiment are configured such that the microcavity of the above-described fourth embodiment has "a negative dielectric/an optical buffer layer/a negative dielectric" as a unit in the emission wavelength. This configuration is capable of obtaining a sharp peak of the absorption spectrum, leading to an advantage that color adjustment of reflected light can be performed with higher precision. The optical buffer layer can be formed of a dielectric, a dielectric multilayer film, a photonic crystal, or the like.

With this configuration, it is possible to obtain a sharp absorption peak and reduce the color shift of reflected light during white color illumination. In addition, by forming the microcavity at a distance that can be interfered from the light emitting point, it is possible to ensure the emission intensity at a specific angle from the front.

Figure 17:
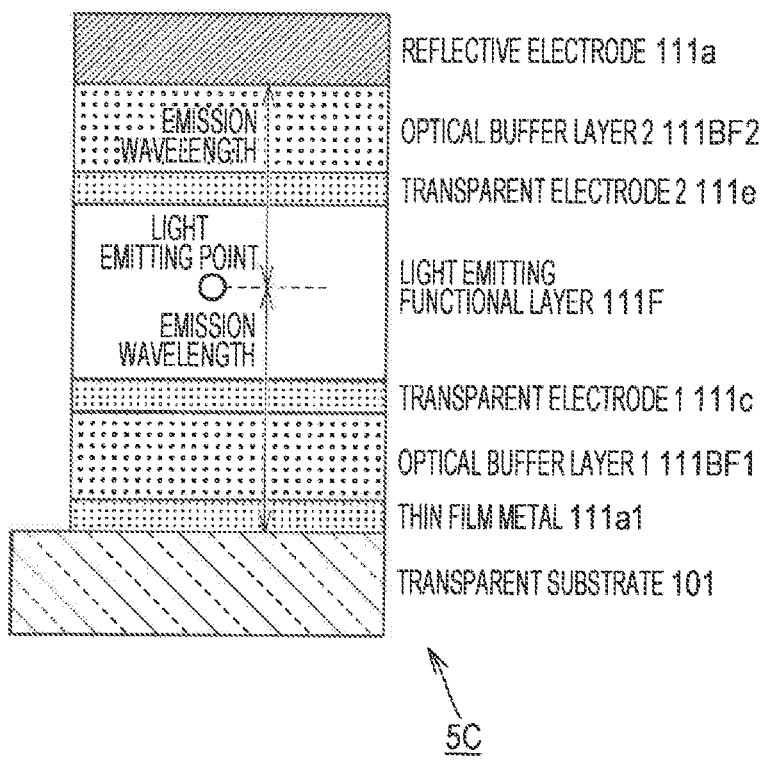
FIG. 17 is a diagram illustrating an optically equivalent model of an electroluminescent device according to another aspect of the fifth embodiment, illustrating an electroluminescent device including an optical buffer layers on both of a transparent substrate side and a reflective electrode side.

FIG. 17 illustrates an optically equivalent model of an electroluminescent device 5C according to another aspect of the present embodiment, illustrating the electroluminescent device 5C including optical buffer layers 111BF1 and 111BF2 on both sides of the transparent substrate 101 side and the reflective electrode 111a side. Even in this configuration, equivalent operational effects can be obtained.

Sixth Embodiment

Figure 18:
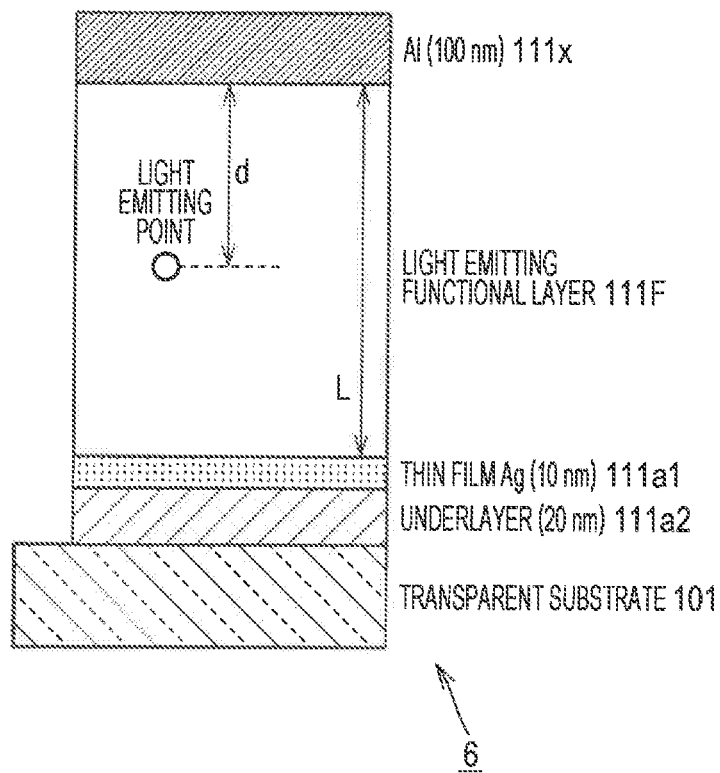
FIG. 18 is an optical schematic diagram of an electroluminescent device in a sixth embodiment.

Next, with reference to FIG. 18, an electroluminescent device 6 according to a sixth embodiment will be described. FIG. 18 is an optical schematic diagram of the electroluminescent device 6 in the present embodiment. Note that the same constituent members as those illustrated in FIGS. 2 and 9 are used.

The electroluminescent device 6 illustrated in FIG. 18 emits light at a centroid wavelength of 660 nm with "single color of red". The film thickness L of the light emitting functional layer is 320 nm, and the distanced from the surface of the reflective electrode to the light emitting point is 60 nm.

Figure 19:
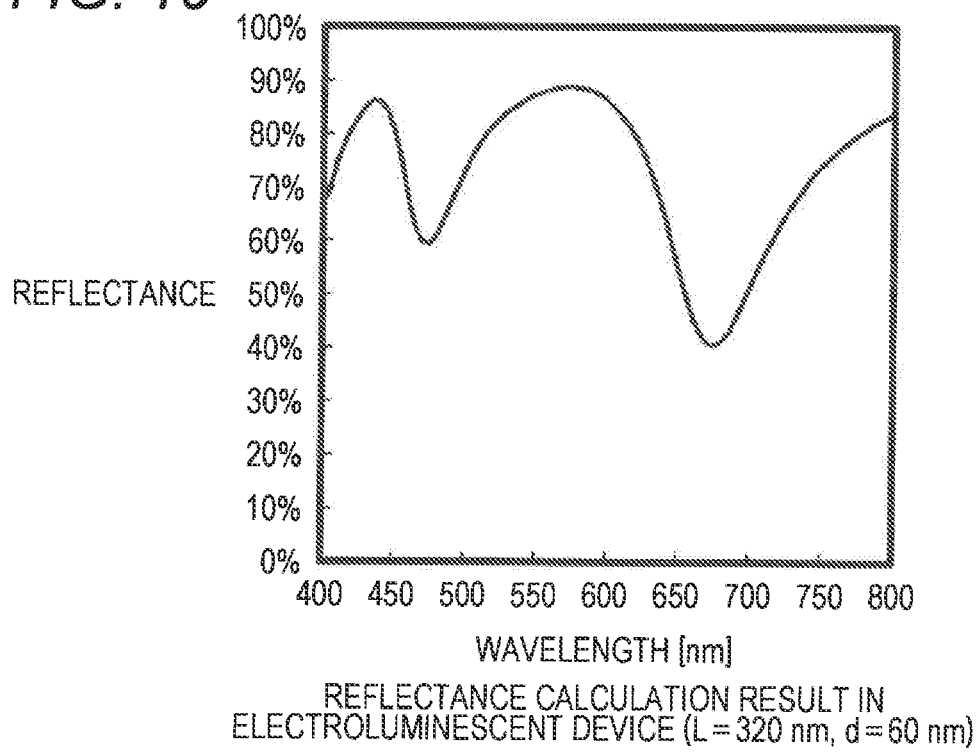
FIG. 19 is a diagram illustrating a reflectance calculation result of an electroluminescent device in the sixth embodiment.

With reference to FIG. 18, results of calculating the reflectance of incidence from air in a configuration with L=320 nm and d=60 nm are illustrated in FIG. 19. As can be seen from FIG. 19, there is an absorption peak at a wavelength of 675 nm near the light emission centroid wavelength of 660 nm. The emission spectrum of the electroluminescent device has a certain range, making it possible to achieve the effect of the present embodiment even when the absorption peak does not strictly match with the centroid wavelength of the emission spectrum. Still, achievement of the match would further enhance front intensity.

As a more desirable condition, it is desirable that the absorption peak is included in the centroid wavelength±25 nm of the emission spectrum, and more desirably, the absorption peak is included in the centroid wavelength±15 nm of the emission spectrum. In the case of the present embodiment, the absorption peak is included in the centroid wavelength±25 nm of the emission spectrum.

It can be seen that there is also an absorption peak in the complementary color region of the emission wavelength (wavelength 469 nm to 552 nm). At this time, calculation is performed to examine the deviation Δuv of the reflected light from the blackbody locus when the standard light (D65) with the color temperature of 6500K is emitted, resulting in |Δuv|=0.008 being smaller than 0.01.

Figure 20:
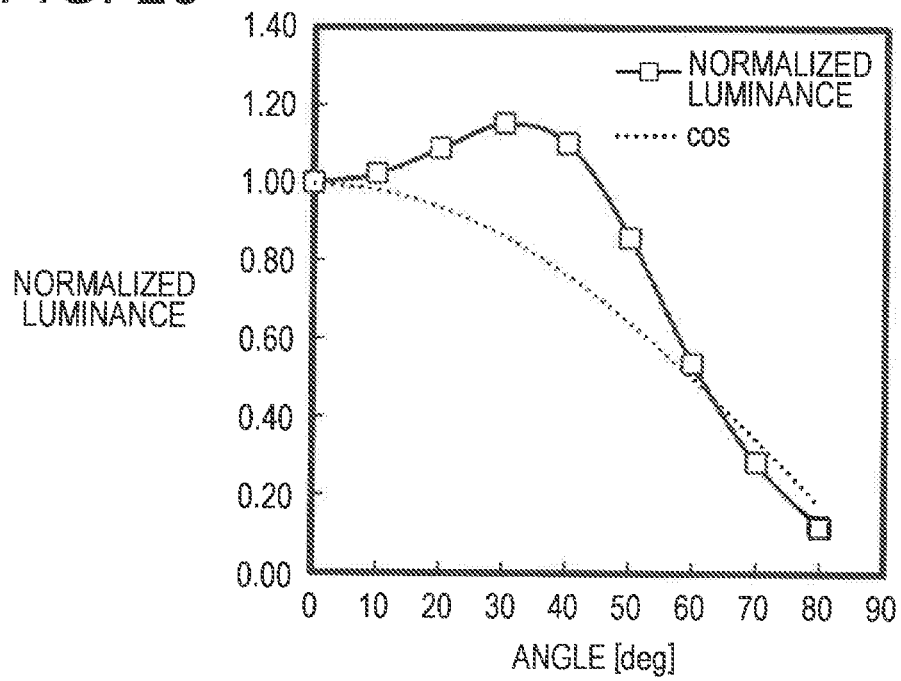
FIG. 20 is a diagram illustrating a calculation result of angle dependence of emission luminance of the electroluminescent device in the sixth embodiment.

In addition, in FIG. 18 having setting of L=320 nm and d=60 nm, results of calculating the angle dependence of the emission luminance are illustrated in FIG. 20. It can be confirmed from FIG. 20 that when $\theta_D$=60 degrees, "D($\theta$) ≥D(0)cos $\theta$(0≤$\theta$≤$\theta_D$≤60°) is satisfied when the angle dependence of the emission intensity is defined as D($\theta$)".

In this manner, "an absorption peak is included in the emission wavelength and at least one absorption peak is included in a complementary color region of an emission wavelength in the range of 380 nm to 780 nm, an absolute value of a deviation Δuv of a color coordinate of front reflected light at the time of white color illumination from a blackbody locus is below 0.02, and a refractive index and a film thickness of each of the plurality of functional layers are determined to satisfy D($\theta$)≥D(0)cos $\theta$ (0≤$\theta$≤$\theta_D$≤60 degrees) when an angle dependence of emission intensity is defined as D($\theta$). With this configuration, it is possible to achieve an electroluminescent device capable of obtaining colorless external light reflection at the time of non-emission while achieving light intensity within a certain angle from the front.

Seventh Embodiment

Next, an electroluminescent device in a seventh embodiment will be described. The electroluminescent device according to the present embodiment is characterized by "having a single color of red and having wavelength absorption peaks in red, green, and blue regions".

As described above, the emission color is "a single color" means that color coordinates from white light defined by International Commission on Illumination (Commission Internationale de L'Eclairage: CIE) are sufficiently separated. In particular, it is desirable that the saturation is 50% or more when viewed in the HSV color space devised by Alvy Ray Smith in 1978, while it is desirable that an xy distance from a white point of white 6500K is 0.1 or more when viewed in the Yxy color space prescribed by the International Commission on Illumination (CIE).

By "Red color", it is desirable that the hue is included in the range of 0 degrees±60 degrees when viewed in the HSV color space, more desirably the hue is included in the range of 0 degrees±30 degrees. In addition, when converted to the centroid wavelength, it is preferable that the centroid wavelength is included in 570 nm to 780 nm, and that the centroid wavelength is included in 580 nm to 780 nm. This configuration would makes it easier to convey to the viewing side information indicating that the emission color is red when applied to traffic signals, signal lamps, for example.

Similarly, with the conversion from the HSV color space to the wavelength range, the "red" wavelength range corresponds to the wavelength 570 nm to 780 nm, and desirably corresponds to 580 nm to 780 nm. The wavelength range of "green" corresponds to a wavelength of 492 nm to 570 nm, and desirably corresponds to 510 nm to 562 nm. The wavelength range of "blue" corresponds to a wavelength of 380 nm to 492 nm, and desirably corresponds to 380 nm to 480 nm.

The electroluminescent device according to the present embodiment corresponds to a configuration in which L=500 nm and d=60 nm in FIG. 18. A luminescent material with emission color of red was selected, and the centroid emission wavelength with this configuration when viewed from the front was 650 nm.

Figure 21:
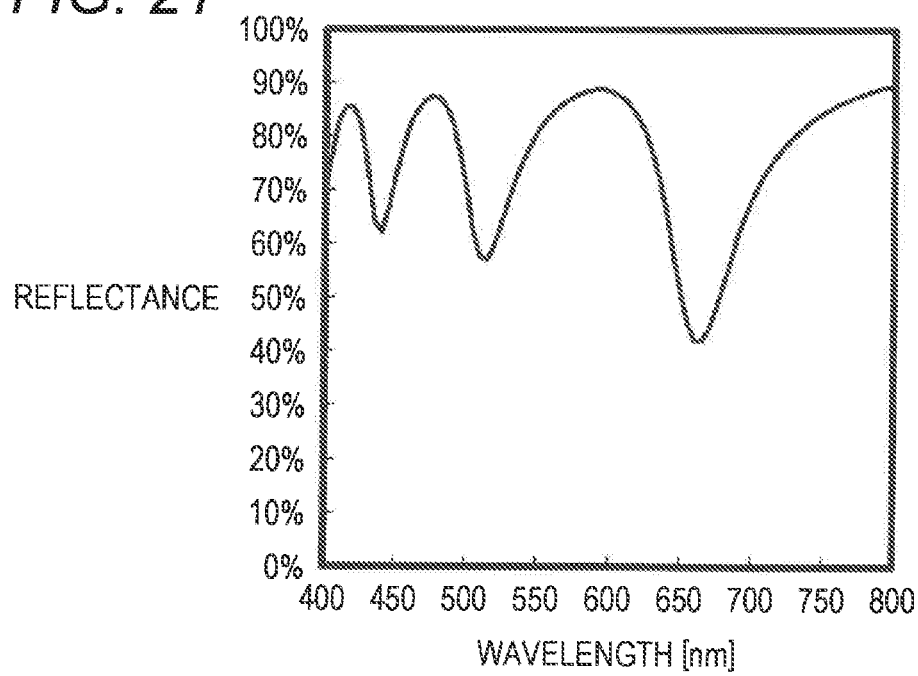
FIG. 21 is a diagram illustrating a reflectance calculation result of an electroluminescent device in a seventh embodiment.

In this configuration, the result of calculating the reflectance of incidence from air is illustrated in FIG. 21. As can be seen from FIG. 21, there is an absorption peak at a wavelength of 665 nm near the emission centroid wavelength of 650 nm. In addition, it is confirmed that the color coordinate of the emission color is (x, y)=(0.70, 0.30) on the xy chromaticity coordinates prescribed by CIE with the xy distance from the white point of 6500K white being 0.1 or more, leading to confirmation that the device emits light with a "monochromatic of red".

The emission spectrum of the electroluminescent device has a certain range, making it possible to achieve the effect of the present embodiment even when the absorption peak does not strictly match with the centroid wavelength of the emission spectrum. Still, the closer to the match, the higher front intensity can be achieved. As a more desirable condition, it is desirable that the absorption peak is included in the centroid wavelength±25 nm of the emission spectrum, and more desirably, the absorption peak is included in the centroid wavelength±15 nm of the emission spectrum. In the case of the present configuration, the absorption peak is included in the centroid wavelength±15 nm of the emission spectrum.

As can be seen from FIG. 21, the configuration of the present embodiment has absorption peaks in regions of 665 nm in wavelength (red), 515 nm in wavelength (green), and 440 nm in wavelength (blue). At this time, calculation is performed to examine the deviation Δuv of the reflected light from the blackbody locus when the standard light (D65) with the color temperature of 6500K is emitted, resulting in |Δuv|=0.001 being smaller than 0.005.

Figure 22:
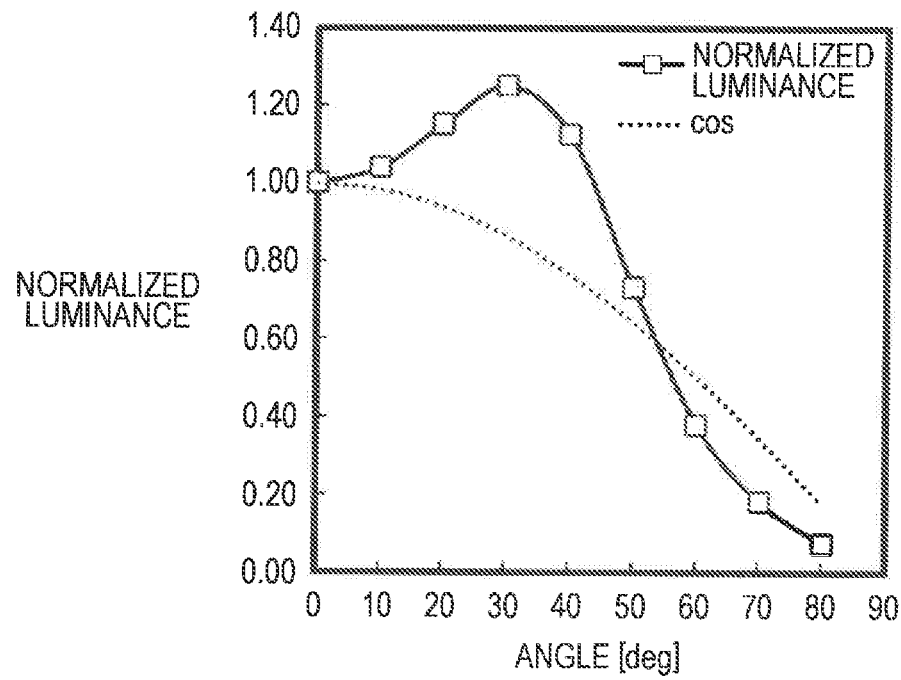
FIG. 22 is a diagram illustrating a calculation result of angle dependence of emission luminance of the electroluminescent device in the seventh embodiment.

In addition, in FIG. 18 having setting of L=320 nm and d=60 nm, results of calculating the angle dependence of the emission luminance are Illustrated in FIG. 22. It can be confirmed from FIG. 22 that when $\theta_D$=50 degrees, the precondition of "D(θ)≥D(0)cos θ(0≤θ≤$\theta_D$≤60°) is satisfied when the angle dependence of the emission intensity is defined as D(O)" is achieved.

As described above, with a "configuration including a single color of red and having wavelength absorption peaks in the red, green, and blue regions", it is possible to achieve a light emitting device having emission color of red, capable of obtaining colorless external light reflection at the time of non-emission while achieving intensity within a certain angular range.

Eighth Embodiment

Figure 23B:
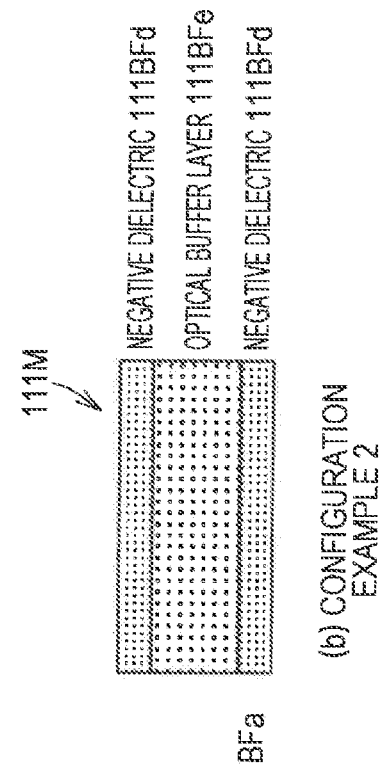

Next, an electroluminescent device in an eighth embodiment will be described. Herein, a specific example of the microcavity explained in the fourth embodiment will be described. The microcavity is formed with an optical buffer layer, or "negative dielectric/optical buffer layer/negative dielectric". The optical buffer layer is a dielectric single film, "a dielectric multilayer film formed by stacking multiple layers of dielectrics having mutually different refractive indices in the emission wavelength," or a photonic crystal. A conceptual diagram for this configuration is illustrated in FIG. 23.

Figure 23A:
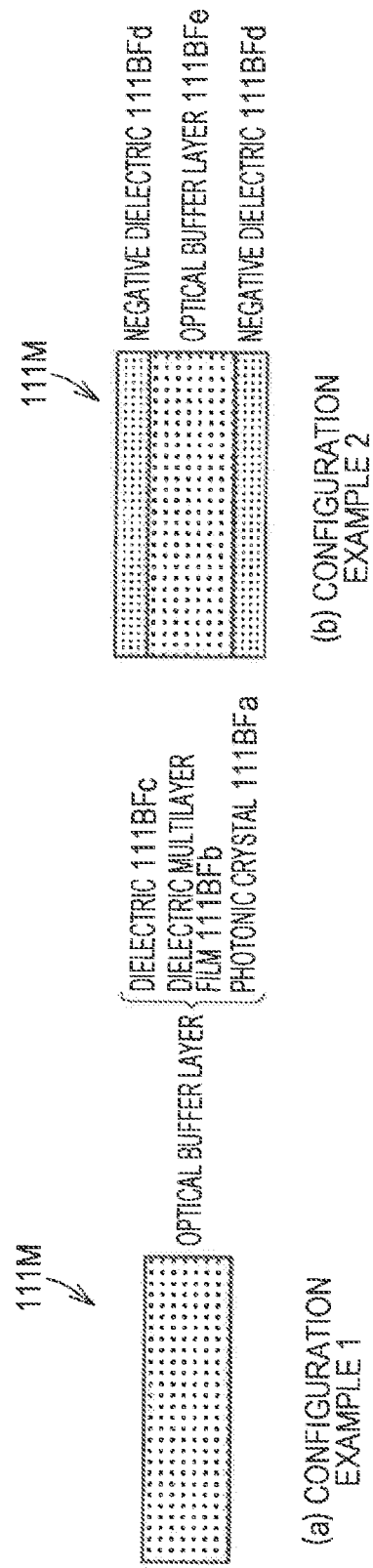
FIG. 23A is a diagram illustrating a first configuration example, and FIG. 23B Is a diagram illustrating a second configuration example.

The microcavity 111M illustrated in FIG. 23A includes a photonic crystal 111BFa, a dielectric multilayer film 111BFb, and a dielectric 111BFc. The microcavity 111M illustrated in FIG. 23B includes a negative dielectric 111BFd, an optical buffer layer 111BFe, and a negative dielectric 111BFd.

With at least one microcavity within the distance of the emission wavelength from the light emitting point, it is possible to reduce color shift at white light reflection at light-off while ensuring the emission intensity within a specific angular range from the front.

In particular, the use of a dielectric multilayer film leads to an advantage of achieving a design with less absorption. In addition, with the use of a photonic crystal, there is an advantage of being able to control such as increasing the front intensity or directing the light to a specific angle.

Figure 24:
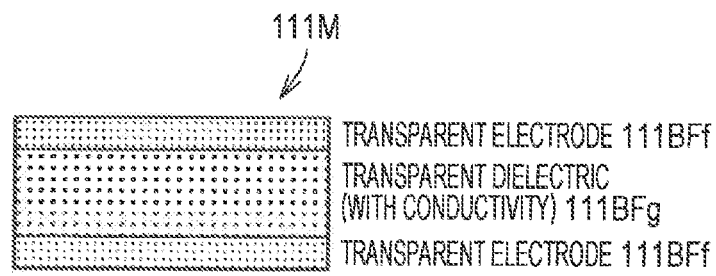
FIG. 24 is a diagram Illustrating a microcavity of another configuration according to the eighth embodiment.

Moreover, a configuration of the microcavity 111M illustrated in FIG. 24 in which a transparent dielectric 111BFg having conductivity is sandwiched between the transparent electrodes 111BFf achieves a synergistic effect of obtaining both microcavity effect and enhanced conductivity. In the configuration illustrated in FIG. 24, a more desirable configuration would be a configuration in which the transparent dielectric 111BFg formed of a conductive organic material is sandwiched between the transparent electrodes 111BFf being a thin film metal electrode. This makes it possible to achieve further enhanced microcavity effect as well as conductivity.

Ninth Embodiment

Figure 25:
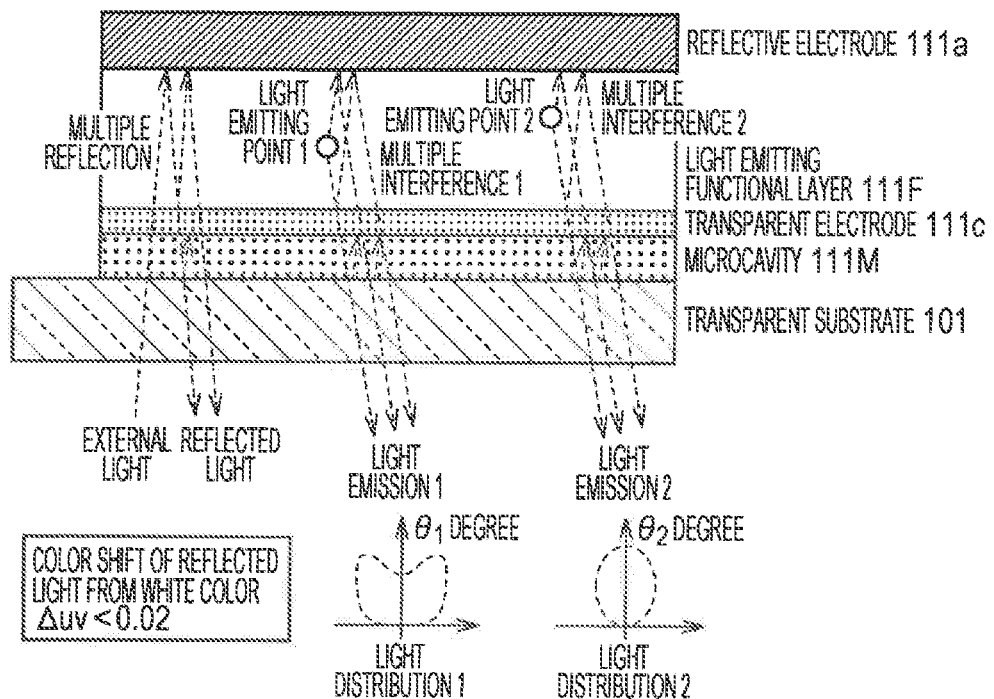
FIG. 25 is an optical schematic diagram of an electroluminescent device in a ninth embodiment.

Next, an electroluminescent device in a ninth embodiment will be described. FIG. 25 is an optical schematic diagram of the present embodiment in which a microcavity is added to a multi-stack configuration. This configuration includes the microcavity 111M provided on the transparent substrate 101, and includes two or more single color-light emitting stacks vertically stacked on the microcavity 111M, and the maximum intensity angle in the angle dependence of the emission intensity at light emission in each of the stacks is mutually different. This configuration generates an absorption peak in at least two wavelengths of a complementary color region of a single color. As illustrated in FIG. 25, with adjustment of the resonance of the microcavity 111M, it is possible to effectively adjust the color shift between the light distribution and the reflected light.

Figure 26:
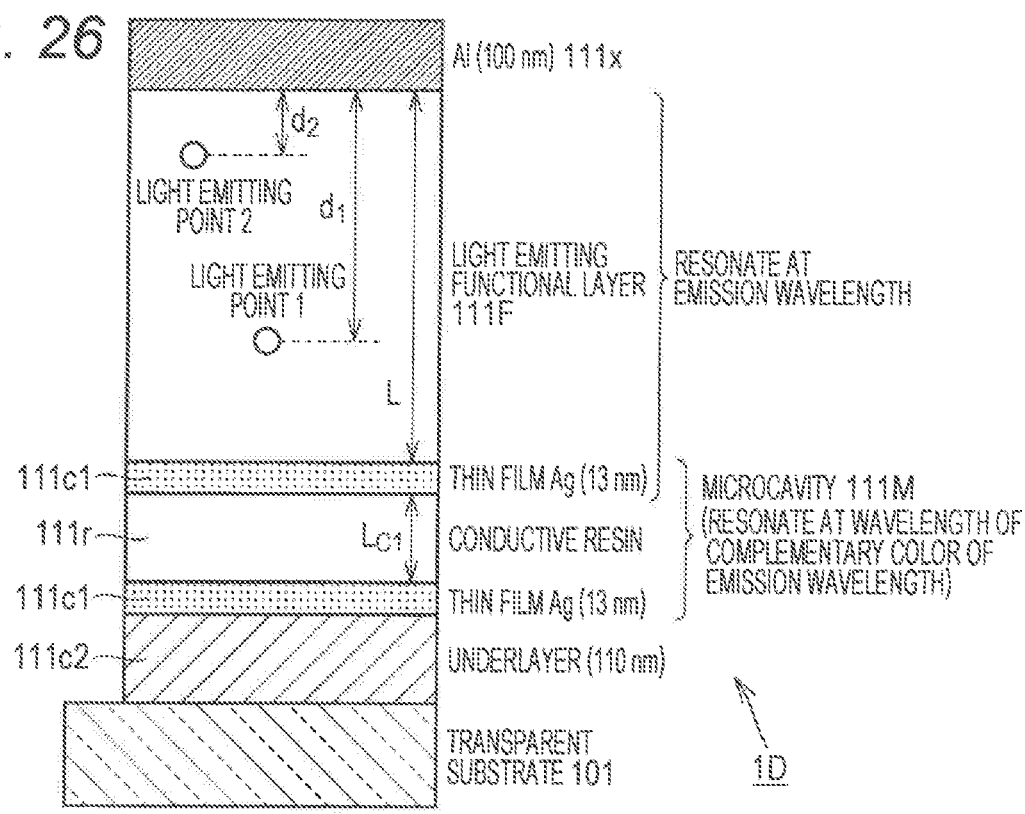
FIG. 26 is a diagram illustrating a specific configuration of the electroluminescent device in the ninth embodiment.

A more specific embodiment will be described below with reference to FIG. 26. FIG. 26 illustrates an electroluminescent device 1D according to the present embodiment. Note that the same constituent members as those illustrated in FIGS. 2 and 9 are used. The optical constant of a conductive resin 111r is substantially the same as the optical constant of the light emitting functional layer 111F. The microcavity 111M includes "thin film metal 111c1/conductive resin 111r/thin film metal 111c1". With this configuration, it is possible to assist promotion of conductivity of the electrode of the thin film metal 111c1 while achieving a strong microcavity effect.

The electroluminescent device 1D illustrated in FIG. 26 has dimensions: d1=270 nm, d2=60 nm, L=460 nm, and $L_{C1}$=95 nm. d1 is a distance from the surface of the reflective electrode to the light emitting point 1. d2 is a distance from the surface of a reflective electrode 111x to the light emitting point 2. L is a thickness of the light emitting functional layer 111F. $L_{C1}$ is a film thickness of the conductive resin 111r forming the microcavity 111M.

Figure 27:
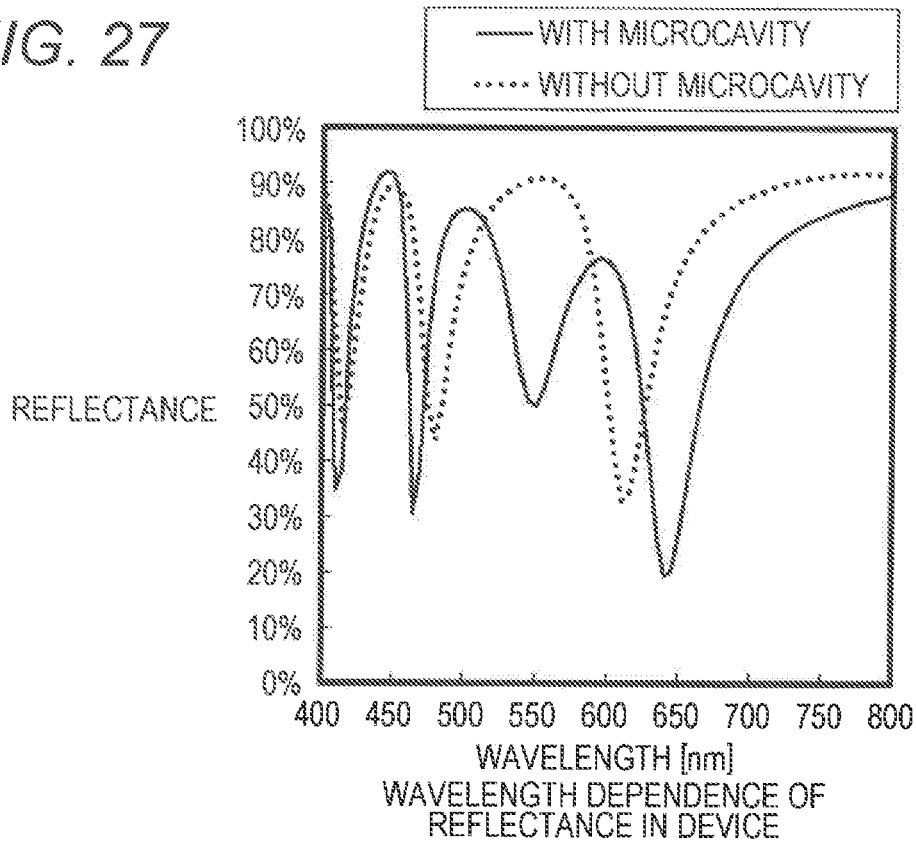
FIG. 27 is a diagram illustrating wavelength dependence of reflectance of the electroluminescent device in the ninth embodiment.

A light emitting material with emission color of red is used in each of units, and the light emission centroid wavelength in this configuration was 641 nm within a red region. It is confirmed that the color coordinate of the emission color is (x, y)=(0.70, 0.30) on the xy chromaticity coordinates prescribed by CIE with the xy distance from the white point of 6500K white being 0.1 or more, leading to confirmation that the device emits light with a "monochromatic of red". FIG. 27 illustrates a result of examination of the wavelength dependence of the front reflectance with this configuration.

As illustrated in the electroluminescent device 1D of the present embodiment, it is confirmed that presence of the microcavity 111M makes it possible to add an absorption peak to a green region with a wavelength of 550 nm, that is, a complementary color region of red. In addition, it can be seen from the diagram that there is an absorption peak also in the blue region. At this time, calculation is performed to examine the deviation Δuv of the reflected light from the blackbody locus when the standard light (D65) with the color temperature of 6500K is emitted, resulting in |Δuv|=0.007 being smaller than 0.01.

Particularly in this configuration, as illustrated in FIG. 26, it is desirable to set to allow the interference between the reflective electrode 111x and the thin film metal 111c1 to be adjusted by changing the film thickness of the light emitting functional layer 111F so as to bring about resonance at the light emission wavelength, and it is desirable to set the resonance of the microcavity 111M so as to resonate at a wavelength of the complementary color region of the emission wavelength. With this setting, it is possible to solve the problem of coloration of the reflected light while enhancing the front Intensity in the emission wavelength.

Figures 28A, 28B, 28C:
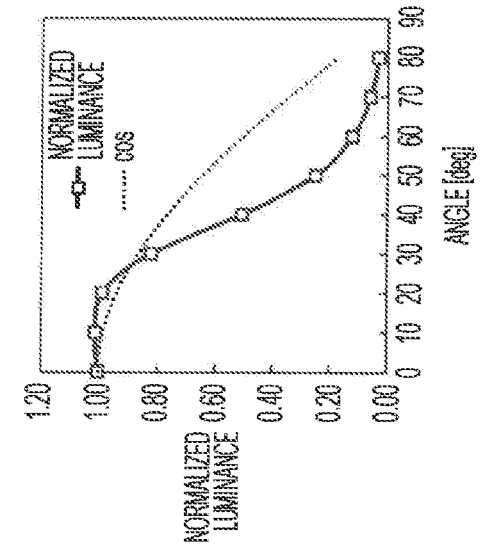
FIG. 28A illustrates a case where all the units emit light.
FIG. 28B illustrates a case where the first light emitting unit alone emits light.
FIG. 28C illustrates a case where the second light emitting unit alone emits light.

FIG. 28 illustrates angular distribution of the emission luminance and luminance distribution at single unit emission. As can be seen from the charts, the intensity peak angle of a light emitting point 1 is 20 degrees and the intensity peak angle of the light emitting point 2 is 10 degrees. In this manner, with a configuration in which the maximum intensity angle in the angle dependence of the emission intensity at light emission in each of light emitting units is mutually different, it is possible to ensure the emission intensity with less variation in a specific angular range.

As described above, with the configuration that "includes two or more single color light-emitting units vertically stacked on the microcavity 111M, and the maximum intensity angle in the angle dependence of the emission intensity at light emission in each of the stacks is mutually different, having an absorption peak in at least two wavelengths of a complementary color region of a single color" and "contains at least one microcavity within the distance of the emission wavelength from the light point", it is possible to achieve, at the electroluminescent device that emits a single color, a light emitting device capable of obtaining colorless external light reflection at the time of non-emission while achieving light intensity within a certain angular range, making it possible to intensify the resonance of light in the microcavity and to improve light distribution and coloration of external light reflection. Particularly in the present configuration, it is desirable that the microcavity has a resonance absorption wavelength in a complementary color region of a single color. This configuration makes it easy to provide an absorption peak to at least two wavelengths of a complementary color region of a single color, achieving an effect of further decreasing coloration of the reflected light.

Figure 29:
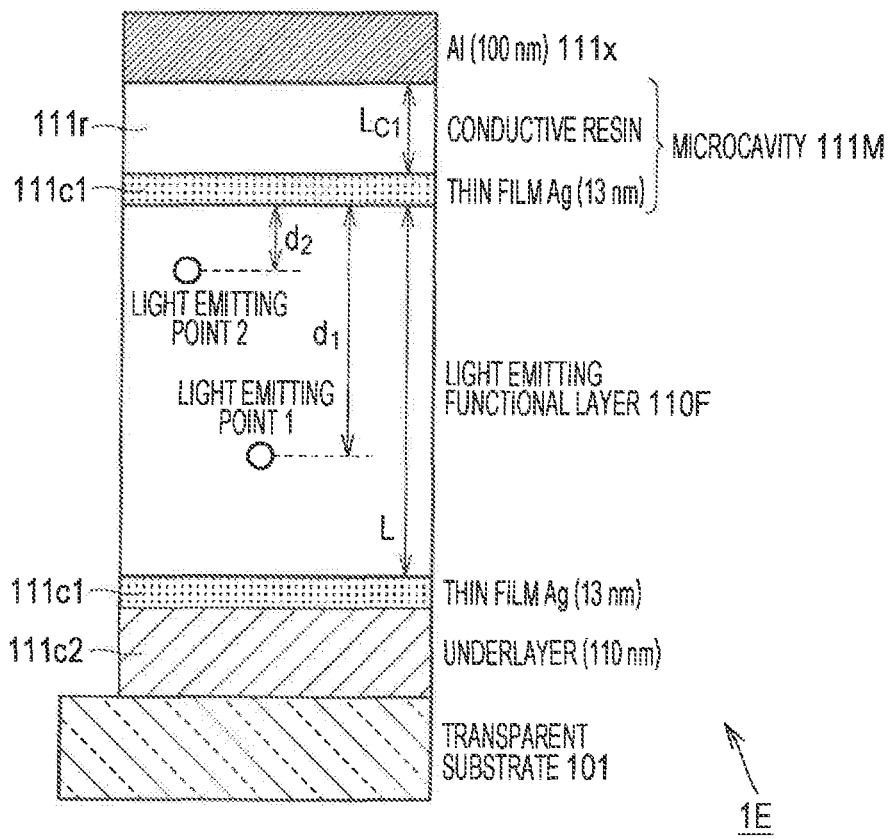
FIG. 29 is a diagram illustrating a configuration of an electroluminescent device obtained by modifying the configuration of the electroluminescent device illustrated in FIG. 26 to a back cavity type.

The position of the microcavity 111M is not limited to the viewing side of light emission, that is, it is allowable to use a back cavity type. FIG. 29 is a diagram illustrating a configuration of an electroluminescent device 1E obtained by modifying the configuration of the electroluminescent device 1D illustrated in FIG. 26 to a back cavity type. This configuration is also capable of obtaining similar effects by appropriately designing the microcavity 111M. The use of the back cavity type makes it possible to obtain an effect of being able to reduce the plasmon loss peculiar to the thick film metal electrode.

Hereinafter, desirable configuration including members for implementing the electroluminescent device of the present embodiment will be described.

[Transparent Member]

Desirable materials for the transparent member used in the present embodiment will be described. In order to achieve uniform surface emission and highly efficient surface emission, it is desirable to achieve high transmittance in the transparent member. Specifically, preferable transparent members for use are those having a total luminous transmittance of 80% or more in the visible light wavelength region measured by a method in conformity with JIS K 7361-1: 1997 (Plastics—Determination of the total luminous transmittance of transparent materials). In addition, a transparent member of a material excellent in flexibility is preferably used.

While appropriate examples of the transparent member include a resin substrate and a resin film, it is preferable to use a transparent resin film from the viewpoint of productivity and performance such as light weight and flexibility. Transparent resin film is a film having a total luminous transmittance of 50% or more in the visible light wavelength region measured by a method in conformity with JIS K 7361-1: 1997 (Plastics—Determination of the total luminous transmittance of transparent materials).

The transparent resin film that can be preferably used is not particularly limited, and its material, shape, structure, thickness, or the like can be appropriately selected from known members. Examples of such a transparent resin film include polyester resin films such as polyethylene terephthalate (PET), polyethylene naphthalate, polyester resin film such as modified polyester, polyethylene (PE) resin film, polypropylene (PP) resin film, polystyrene resin film, polyolefin resin film such as cyclic olefin resin, polyvinyl chloride, vinyl resin film such as polyvinylidene chloride, polyetheretherketone (PEEK (registered trademark)) resin film, polysulfone (PSF) resin film, polyether sulfone (PES) resin, polycarbonate (PC) resin film, polyamide resin film, polyimide resin film, acrylic resin film, and triacetyl cellulose (TAC) resin film.

A resin film having the total light transmittance of 80% or more as above is more preferably used as the transparent member according to the present embodiment. Among them, the transparent members to be preferably used from the viewpoints of transparency, heat resistance, easy handling, strength and cost would be biaxially oriented polyethylene terephthalate film, biaxially oriented polyethylene naphthalate film, polyether sulfone film or polycarbonate film. Among these, the members such as biaxially oriented polyethylene terephthalate film or biaxially oriented polyethylene naphthalate film are more preferable.

Moreover, it is allowable to form an inorganic coating, an organic coating, or a hybrid coating of an inorganic substance and an organic substance on the front surface or the back surface of a film-like substrate. It is preferable that the substrate with such coating formed is a barrier film having water vapor permeability (25±0.5° C., relative humidity (90±2)% RH) of $1 \times 10^{-3}$ g/(m²·24 h) or less as measured by a method in accordance with JIS K 7129-1992. and furthermore, preferable that the substrate is a high barrier film having oxygen permeability measured by a method in accordance with JIS K 7126-1987 of $1 \times 10^{-3}$ ml/m²·24 h·atm or less and having water vapor permeability (25±0.5° C., relative humidity (90±2)% RH) is $1 \times 10^{-3}$ g/(m²·24 h) or less.

The material for forming a barrier coating to be formed on the front surface or the back surface of the film-like substrate in order to obtain a high barrier film may be a material having a function of suppressing intrusion of substances causing degradation of devices such as moisture and oxygen, and thus, silicon oxide, silicon dioxide, silicon nitride, or the like can be used, for example. In order to further improve brittleness of the barrier film, it is more preferable to provide a stacked structure of these inorganic layers and a layer formed of an organic material. While there is no particular limitation on the stacking order of the inorganic layer and the organic layer, it is preferable to alternate stacking of each for a plurality of times.

In order to ensure wettability and adhesiveness, it is possible to provide the transparent member according to the present embodiment with surface treatment and an adhesion-promoting layer. For the surface treatment and adhesion-promoting layer, conventionally known techniques can be used. For example, the surface treatment may include surface activation treatment such as corona discharge treatment, flame treatment, ultraviolet ray treatment, high frequency treatment, glow discharge treatment, active plasma treatment, and laser treatment. Examples of the adhesion-promoting layer include polyester, polyimide, polyurethane, vinyl copolymer, butadiene copolymer, acrylic copolymer, vinylidene copolymer, and epoxy copolymer. The adhesion-promoting layer may be a single layer, or may include two or more layers in order to improve the adhesiveness.

[Transparent Electrode]

An example of the material used as the transparent electrode is a transparent oxide semiconductor (ITO, IZO, ZnO, or InGaO₃). A transparent oxide semiconductor has a characteristic that its refractive index is close to that of an organic material and its reflectance is low as seen from the emissive layer. This makes this material advantageous to achieve a highly efficient device.

As the transparent electrode, a conductive resin that can be produced at low cost using a coating method may be used in addition to a transparent oxide semiconductor for the transparent electrode. Examples of a conductive resin material used as an electron transferring electrode include a perylene derivative or a fullerene derivative such as phenyl C61 butyric acid methyl ester (PCBM). For example, the optical constants of visible light in the case of PCBM are (refractive index n=2.2, extinction coefficient κ=0.25), and the electrode reflectance viewed from the emissive layer is higher than that of the resin having a refractive index of 1.5.

The conductive resin material used as the hole transferring electrode is poly(3,4-ethylenedioxythiophene) (PEDOT)/poly(4-styrenesulfonate)(PSS), poly(3-hexylthiphene))(P3HT), poly(3-octylthiophene) (P3OT), poly(3-dodecylthiophene-2,5-Diyl)(P3DDT), and poly(9,9-dioctylfluorene-co-bithiophene) alternating copolymer (F8T2), or the like.

For example, in the case of PEDOT/PSS, the optical constant of visible light is (refractive index n=1.5, extinction coefficient κ=0.01), and the electrode reflectance viewed from the emissive layer is the equivalent value as the resin with refractive index 1.5, being lower than PCBM in reflectance. In order to increase the electric conductivity of the transparent electrode, it is allowable to use a metal mesh, a metal nanowire, metal nanoparticles or the like in combination. In this case, since the electron conductivity of the electrode using the metal nanowire is increased to lower the average refractive index, leading to a tendency of higher reflectance viewed from the emissive layer. In the present embodiment, a transparent electrode material having low reflectance viewed from the emissive layer would be preferable because of its capability of efficiently extracting light scattered in the waveguide mode to the transparent substrate.

Another case is to use a thin film metal electrode as a transparent electrode. Among them, it is particularly desirable to use a transparent electrode in which a nitrogen-containing underlayer and a thin film metal are combined, as disclosed in JP-A-2011-146144, for example. The nitrogen-containing underlayer has a property of forming the thin film metal on a continuous film. The thin film metal formed as a continuous film has a high Fresnel reflectance at the interface, making it possible to enhance the light interference effect, making this suitable for the present embodiment.

Herein, the metal is a material in which the real part of the complex relative dielectric constant is negative in the emission wavelength of the surface emitting panel. The complex relative dielectric constant $\varepsilon_c$ is an optical constant related to the interface reflection, and is a physical quantity that can be expressed by the following Formula (29) using a refractive index n and an extinction coefficient κ.

[Mathematical Expression 31]

$$\varepsilon_c = (n^2 - \kappa^2) + 2in\kappa$$

$$P = (\varepsilon_c - \varepsilon_o)E \qquad \text{Formula (29)}$$

where, P and E represent polarization and electric field, respectively, and $\varepsilon_c$ is dielectric constant in vacuum. It is observed from Formula (29) that the smaller the n is and the larger the K is, the smaller the real part of the complex relative dielectric constant becomes. This corresponds to a phase shift effect in the polarization response due to the oscillation of the electrons against the oscillation of the electric field. When the real part of the complex relative dielectric constant represented by the Formula (29) is negative, this means inversion of the electric field oscillation and the polarization response, defining a characteristic of the metal. Conversely, when the real part of the complex relative dielectric constant is positive, the direction of the electric field matches with the direction of the polarization response, Indicating the polarization response as a dielectric. In summary, the medium in which the real part of the complex relative dielectric constant is negative is a metal, and the substance in which the real part of the complex relative dielectric constant is positive is the dielectric.

Generally, the smaller the refractive index n is and the larger the extinction coefficient κ is, the more the electron oscillates in the material. Materials with a high electron transfer property tend to have a small refractive index n and a large extinction coefficient κ. Particularly in the metal electrode, n is about 0.1, whereas the extinction coefficient κ has a large value of 2 to 10 and the rate of change with respect to the wavelength is also large. Therefore, even when the refractive index n is the same value, the value of the extinction coefficient κ has large mutual difference, leading to a large difference in electron transfer performance.

In the present embodiment, it is desirable that the material of the transparent electrode is a metal that increases the Fresnel reflectance. As a more specific precondition of the refractive index, a metal having a small refractive index n and a large extinction coefficient κ to improve electron response is desirable. Examples of desirable materials include aluminum (Al), silver (Ag) and calcium (Ca). Another example is gold (Au) having an advantage of being less susceptible to oxidation. Another material is copper (Cu), which is characterized by its good conductivity.

Other exemplary materials having excellent thermal properties and chemical properties, and less susceptible to oxidation and unlikely to cause chemical reaction with the substrate material even at high temperatures include platinum, rhodium, palladium, ruthenium, iridium, and osmium. Alternatively, an alloy using a plurality of metal materials may be used. In particular, MgAg and LiAl are often used as thin film transparent metal electrodes.

As the particularly desirable film thickness d of a thin film metal, the following formula (30) can be given from the distance causing attenuation to the light intensity 1/e by using the extinction coefficient κ and the emission wavelength λ.

[Mathematical Expression 32]

$$d \leq \frac{\lambda}{4\pi}\kappa \qquad \text{Formula (30)}$$

With more specific values, the extinction coefficient κ is 2.7 when an Ag thin film is used at a wavelength of 475 nm, since, leading to the following Formula (31). Accordingly, the film thickness is preferably 13.9 nm or less.

[Mathematical Expression 33]

$$d \leq \frac{\lambda}{4\pi\kappa} = \frac{475}{4\pi \times 2.7} = 13.9 \text{ nm} \qquad \text{Formula (31)}$$

[Negative Dielectric]

A negative dielectric is a material in which the complex relative dielectric constant given by the Formula (29) is negative in the emission wavelength. A typical example is a thin film metal and photonic crystals or the like can also achieve a negative dielectric constant at a specific wavelength. In a case where the metal thin film is used as a negative dielectric in the present embodiment, it is possible to achieve a sharp absorption peak, leading to an advantage of being able to precisely control the color shift of reflected light. In contrast, in a case where a photonic crystal is used, there is an advantage of being able to bringing the light distribution of emission close to a specific angle or forming an absorption peak of a specific wavelength by design.

[Optical Buffer Layer]

The optical buffer layer can be formed with a photonic crystal structure, other than a dielectric or a dielectric multilayer film. In order to form a dielectric multilayer film or a photonic crystal structure, there is a need to combine materials having a plurality of dielectric constants, and thus, it is desirable that the dielectric material be transparent at the wavelength at which light is generated in the emissive layer. As a transparent material, a material used as a transparent member can be used. An example of an applicable material is $TiO_2$ (refractive index n=2.5) and SiOx (refractive index n=1.4 to 3.5). Examples of other dielectric materials include diamond, calcium fluoride (CaF), and silicon nitride ($Si_3N_4$).

Examples of the resin materials include vinyl chloride, acrylic, polyethylene, polypropylene, polystyrene, ABS, nylon, polycarbonate, polyethylene terephthalate, polyvinylidene fluoride, Teflon (registered trademark), polyimide, and phenol resin. The refractive index of these is in the range of 1.4 to 1.8. There is also a technique of controlling to increase or decrease the refractive index by mixing nanoparticles or the like, and it is possible to bring the refractive index close to 1 with a plastic material mixed with hollow nanosilica. It is also possible to achieve a refractive index close to 2 by mixing particles of a high refractive index material such as $TiO_2$ with the resin.

Design variables of the present embodiment related to the optical buffer layer include the thickness of each of members constituting the buffer layer and the complex relative dielectric constant. The complex relative dielectric constant is calculated from the refractive index and the extinction coefficient using Formula (29), and when it has a birefringence index, it is defined as the tensor amount having a component in the three-dimensional axial direction. In a case where the optical buffer layer includes a plurality of members, variables and optical constants for determining the structure of Individual members are included in the design variable.

[Reflective Electrode]

The material of the reflective electrode can be formed with the metal material exemplified as the material of the transparent thin film metal layer. Other alloys and inks containing metal nanoparticles may be used. In addition, a transparent electrode, a dielectric multilayer film mirror, a metal Irregular structure or a photonic crystal may be used in combination as a reflective layer. In the case of using a dielectric multilayer film mirror, a metal Irregular structure or a photonic crystal as a reflection layer, there is an advantage of being able to eliminating the plasmon loss in the reflection layer.

Design variables of the present embodiment related to the reflective electrode include the thickness of the member and the complex relative dielectric constant. The complex relative dielectric constant is calculated from the refractive index and the extinction coefficient using Formula (29), and when it has a birefringence index, it is defined as the tensor amount having a component in the three-dimensional axial direction. In addition, in a case where the reflective electrode includes a plurality of members, variables and complex relative permittivity for determining the structure of individual members are included in the design variable.

[Peak Angle of Light Intensity at Single Unit Emission]

Figure 30:
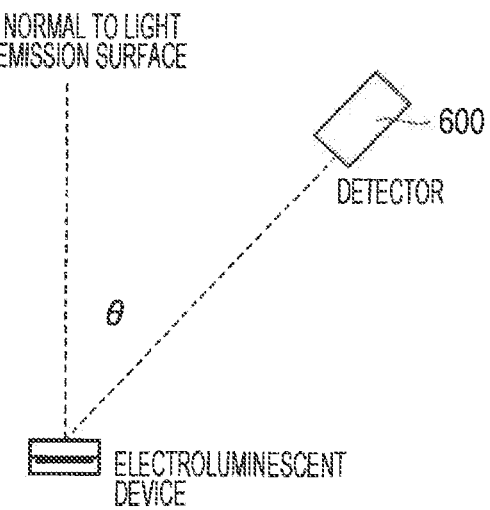
FIG. 30 is a schematic diagram illustrating angle dependence of the luminance of light emitted from a transparent member to an observer side, in an electroluminescent device.

In this description, this angle is sometimes written as "emission intensity peak angle", or simply as "peak angle". The definition of the peak angle will be described below. FIG. 30 is an illustration for explanation. A surface emitting panel is arranged in the air, and a detector is arranged in a direction forming an angle θ from the surface normal of the surface emitting panel. In this state, the angle dependence $D(\theta)$ of the light intensity is measured. Here, the electroluminescent device is set to allow solely one light emitting unit to emit light.

For example, in a case where solely the first light emitting unit 110B is measured by the electroluminescent device 2 illustrated in FIG. 12, the emissive layer 111b3 of the first light emitting unit 110B alone is allowed to emit light. More specifically, the model illustrated in FIG. 30 may be operated by the optical simulator so as to calculate the angle dependence $D(\theta)$ of the light intensity in a state where the first light emitting unit 110B alone emits light. In addition, an optically equivalent device may be prepared and measured in the air.

$D(\theta)$ measured in this manner is graphed to obtain the angle at which the maximum value is obtained. Depending on the design, there may be two or more peak angles in some cases. In the present embodiment, the maximum peak with the highest intensity or the maximum peak closest to the front is used.

The light intensity to be used is either the integral intensity of all wavelengths or the luminance weighted by luminosity factor. In particular, since the light intensity corresponding to the human vision can be measured, it is desirable to use the luminance weighted by luminosity factor.

In the present embodiment, the following Formula (1) needs to be satisfied for a specific angle $\theta_D$.

[Mathematical Expression 34]

$$D(\theta) \geq D(0)\cos\theta (0 \leq \theta \leq \theta_D \leq 60 \text{ degrees})$$  Formula (1)

In general, the angle dependence of the light intensity of perfectly diffused light satisfies the following Formula (32).

[Mathematical Expression 35]

$$D(\theta) = D(0)\cos\theta$$  Formula (32)

Here, $D(\theta)$ is the front intensity. Therefore, the case where the intensity is higher than $D(\theta)\cos\theta$ indicates that the visibility is better than a diffuse reflector plate. This is an important characteristic in applications to the cases of light-ing used to transmit information with good visibility in a specific angular range (such as downlights for decorative illumination, colored spotlights in theaters, colored signaling flashlights, traffic signals, colored front lights, backlights, brake lights for cars). In addition, it is desirable in such applications to suppress brightness at a specific angle or more. Therefore, it is preferable to satisfy the following Formula (33).

[Mathematical Expression 36]

$$D(\theta) \geq D(0)\cos\theta (0 < \theta \leq \theta_D) \text{ and}$$

$$D(\theta) < D(0)\cos\theta (\theta_D < \theta < 90 \text{ degrees}, \theta < \theta_D < 60 \text{ degrees})$$  Formula (33)

An electroluminescent device of the present embodiment emits light of a single color and has a plurality of functional layers, in which an absorption peak is included in the emission wavelength and at least one absorption peak is included in a complementary color region of an emission wavelength in the range of 380 nm to 780 nm, an absolute value of a deviation (Δuv) of a color coordinate of front reflected light at the time of white color illumination from a blackbody locus is below 0.02, and a refractive index and a film thickness of each of the plurality of functional layers are determined to satisfy the formula $D(\theta) \geq D(0)\cos\theta (0 \leq \theta \leq \theta_D \leq 60$ degrees) when an angle dependence of emission intensity is defined as $D(\theta)$.

In another embodiment, $\theta_D$ is 30 degrees. In another embodiment, the electroluminescent device includes a configuration in which two or more light emitting units that emit a single color are vertically stacked, and the maximum intensity angle in the angle dependence of the emission intensity at emission in each of light emitting units is mutually different, and having an absorption peak in at least two wavelengths of a complementary color region of the single color.

In another embodiment, the single color is red and has wavelength absorption peaks in the red, green, and blue regions.

In another embodiment, the electroluminescent device has a light emitting point and includes at least one microcavity within a distance of the emission wavelength from the light emitting point.

In another aspect, the microcavity is configured in units of a negative dielectric layer, a positive dielectric layer, and a negative dielectric layer in the emission wavelength.

While the embodiments have been described as above, the embodiments disclosed in the present invention are all illustrative in all respects and are not restrictive. The scope of the present embodiments is indicated by the scope of the claims, and includes meanings equivalent to claims and all changes within the scope.

REFERENCE SIGNS LIST 1, 1D, 1E, 2, 4, 4A, 4B, 4C, 4D, 5A, 5B, 5C, 6 Electroluminescent device
101 Transparent substrate
110B First light emitting unit
110C Second light emitting unit
111F Light emitting functional layer
111BF, 111BF1, 111BF2 Optical buffer layer
111BFc, 111BFd Dielectric
111BFf, 111c Transparent electrode
111BFg Transparent dielectric
111a, 111x Reflective electrode 111*b*1 Electron injection layer
111*b*2 Electron transfer layer
111*b*3 Emissive layer
111*c*1 Thin film metal
111*c*2 Underlayer
111*r* Conductive resin

The invention claimed is:

1. An electroluminescent device that emits light of a single color and comprises a plurality of functional layers,
wherein an absorption peak is included in an emission wavelength and at least one absorption peak is included in a complementary color region of the emission wavelength in a range of 380 nm to 780 nm,
an absolute value of a deviation (Δuv) of a color coordinate of front reflected light at the time of white color illumination from a blackbody locus is below 0.02, and
a refractive index and a film thickness of each of the plurality of functional layers are determined to satisfy the following Formula (1) when an angle dependence of emission intensity is defined as D(θ)

$$D(\theta) \geq D(0)\cos\theta (0 \leq \theta \leq \theta_D \leq 60 \text{ degrees})$$ Formula (1).

2. The electroluminescent device according to claim 1, wherein $\theta_D$ is 30 degrees.

3. The electroluminescent device according to claim 1, comprising a configuration in which two or more light emitting units that emit a single color are vertically stacked, wherein a maximum intensity angle in angle dependence of the emission intensity at emission in each of the light emitting units is mutually different, and
an absorption peak exits in at least two wavelengths of a complementary color region of the single color.

4. The electroluminescent device according to claim 1, wherein the single color is red, and wavelength absorption peaks exit in red, green, and blue regions.

5. The electroluminescent device according to claim 1, wherein
the electroluminescent device has a light emitting point, and
at least one microcavity is included within a distance of the emission wavelength from the light emitting point.

6. The electroluminescent device according to claim 1, wherein the microcavity is configured in units of a negative dielectric layer, a positive dielectric layer, and a negative dielectric layer in the emission wavelength.

7. The electroluminescent device according to claim 2, comprising a configuration in which two or more light emitting units that emit a single color are vertically stacked, wherein a maximum intensity angle in angle dependence of the emission intensity at emission in each of the light emitting units is mutually different, and
an absorption peak exits in at least two wavelengths of a complementary color region of the single color.

8. The electroluminescent device according to claim 2, wherein the single color is red, and wavelength absorption peaks exit in red, green, and blue regions.

9. The electroluminescent device according to claim 2, wherein
the electroluminescent device has a light emitting point, and
at least one microcavity is included within a distance of the emission wavelength from the light emitting point.

10. The electroluminescent device according to claim 2, wherein the microcavity is configured in units of a negative dielectric layer, a positive dielectric layer, and a negative dielectric layer in the emission wavelength.

11. The electroluminescent device according to claim 3, wherein the single color is red, and wavelength absorption peaks exit in red, green, and blue regions.

12. The electroluminescent device according to claim 3, wherein
the electroluminescent device has a light emitting point, and
at least one microcavity is included within a distance of the emission wavelength from the light emitting point.

13. The electroluminescent device according to claim 3, wherein the microcavity is configured in units of a negative dielectric layer, a positive dielectric layer, and a negative dielectric layer in the emission wavelength.

14. The electroluminescent device according to claim 4, wherein
the electroluminescent device has a light emitting point, and
at least one microcavity is included within a distance of the emission wavelength from the light emitting point.

15. The electroluminescent device according to claim 4, wherein the microcavity is configured in units of a negative dielectric layer, a positive dielectric layer, and a negative dielectric layer in the emission wavelength.

16. The electroluminescent device according to claim 5, wherein the microcavity is configured in units of a negative dielectric layer, a positive dielectric layer, and a negative dielectric layer in the emission wavelength.

* * * * *